United States Patent [19]

Freuler et al.

[11] Patent Number: 5,770,972
[45] Date of Patent: *Jun. 23, 1998

[54] COUPLING CIRCUIT

[75] Inventors: George H. Freuler, Moreno Valley; Edward J. Collier, deceased, late of Anaheim, by Ilene Y. Collier, executor; David Mazi, Morano Valley; R. David Middlebrook, San Dimas, all of Calif.

[73] Assignee: Zero Impedance Systems, Inc., Yorba Linda, Calif.

[*] Notice: The term of this patent shall not extend beyond the expiration date of Pat. No. 5,300,893.

[21] Appl. No.: 800,624

[22] Filed: Feb. 14, 1997

Related U.S. Application Data

[60] Division of Ser. No. 413,194, Mar. 27, 1995, Pat. No. 5,604,463, which is a continuation-in-part of Ser. No. 914,568, Jul. 17, 1992, Pat. No. 5,402,084, which is a continuation-in-part of Ser. No. 851,334, Mar. 16, 1992, Pat. No. 5,300,893.

[51] Int. Cl.$^6$ ....................................................... H03F 1/26
[52] U.S. Cl. .......................................... 330/149; 330/255
[58] Field of Search .................................... 330/146, 149, 330/207 R, 255, 292, 297

[56] References Cited

U.S. PATENT DOCUMENTS

| | | | |
|---|---|---|---|
| 2,956,236 | 10/1960 | Klestadt | 330/123 |
| 3,987,322 | 10/1976 | Ludlum | 330/297 X |
| 4,107,619 | 8/1978 | Pass | 330/255 |
| 4,254,380 | 3/1981 | Guillen | 330/275 |
| 4,283,683 | 8/1981 | Main | 330/262 |
| 4,398,159 | 8/1983 | Ball et al. | 330/262 |
| 4,404,527 | 9/1983 | Schertz et al. | 330/84 |
| 4,518,928 | 5/1985 | Ishii | 330/297 |
| 4,520,322 | 5/1985 | Ishii | 330/263 |
| 4,560,946 | 12/1985 | Yokoyama | 330/149 |
| 4,577,160 | 3/1986 | Lettvin et al. | 330/149 |
| 4,611,180 | 9/1986 | Stanley | 330/298 |
| 4,667,166 | 5/1987 | Itoh | 330/260 |
| 4,716,378 | 12/1987 | Jiko et al. | 330/108 |
| 4,721,919 | 1/1988 | LaRosa et al. | 330/146 |
| 4,752,747 | 6/1988 | Botti et al. | 330/297 |
| 4,791,381 | 12/1988 | Lenz | 330/84 |
| 5,300,893 | 4/1994 | Freuler et al. | 330/84 |
| 5,402,084 | 3/1995 | Freuler et al. | 330/146 |
| 5,604,463 | 2/1997 | Freuler et al. | 330/149 |

FOREIGN PATENT DOCUMENTS

| | | | |
|---|---|---|---|
| 0083529 | 7/1983 | European Pat. Off. . | |
| 59-108408 | 6/1984 | Japan | 330/297 |
| 59-174005 | 10/1984 | Japan | 330/297 |

OTHER PUBLICATIONS

Brady, R.M. "The Floating Bridge" WirelessWorld, Sep. 1980 pp. 40–43.

Brady, R.M. "The Floating Bridge", Antenna (Italy), No. 2, Feb. 1981 pp. 60–63.

"High Power Auxiliary Amplifier for Automobile Application", Electronics Applications Ind. No. 237, May 15, 1977, (France).

Handbook of Modern Electronics and Electrical Engineering; Belove, pp. 727 & 728, 1986.

*Primary Examiner*—Steven Mottola
*Attorney, Agent, or Firm*—Loeb & Loeb LLP

[57] ABSTRACT

A coupling circuit composed of an input terminal for receiving an input signal from a source and first and second output terminals for supplying an output signal to a load; a signal processing device connected between the input terminal and the first output terminal for deriving an output signal from the input signal and for supplying the output signal to a load connected between the output terminals; a power supply; connecting lines each having a finite impedance and connected for supplying operating power from the power supply to the signal processing device, a distortion eliminating circuit connected between the power supply and the second output terminal for directing load current to the signal processing device so as to bypass the load current from the line impedances, the distortion eliminating device including at least one active circuit element and having an electric characteristic corresponding substantially to a capacitor with infinite capacitance.

16 Claims, 22 Drawing Sheets distorted output:

a clean output is hoped for:

COUPLING CIRCUIT

CROSS REFERENCE TO RELATED APPLICATION

This application is a division of application Ser. No. 08/413,194 filed Mar. 27, 1995, now U.S. Pat. No. 5,604, 463, which is a continuation-in-part of application Ser. No. 914,568 filed Jul. 17, 1992, now U.S. Pat. No. 5,402,084, which is itself a continuation-in-part of application Ser. No. 851,334 filed Mar. 16, 1992, now U.S. Pat. No. 5,300,893.

BACKGROUND OF THE INVENTION

The present invention relates to coupling circuits for coupling signals between components in electronic systems. Electronic system performance often falls short of expectations based on component/device specifications, so that system designers routinely derate devices they incorporate.

The operation of many electrical and electronic systems relies on the application of a voltage across a load from a voltage source and it is recognized in the art that the performance of such systems depends on the quality of the coupling between the source and the load, i.e. the extent to which the voltage across the load corresponds to, or equals, the open circuit source voltage or an amplified version of the source voltage.

Ideal coupling would result in the appearance of a voltage, or possibly a current, exactly proportional to the open circuit source voltage across the load with respect to both time and frequency domain characteristics as the source signal.

The achievement of ideal coupling would be advantageous in many electronics systems. For example, if the signal source is an electronic or electrical circuit port, the load is an oscilloscope employed to monitor the time domain waveform of the voltage developed by the signal source and the intervening coupling medium is the oscilloscope probe and associated cabling, the oscilloscope trace will accurately reflect the waveform of the source voltage only if the voltage applied to the oscilloscope inputs is identical to the open circuit source voltage.

For many other types of electronic systems, ideal coupling would produce optimum results. This would also be the case in a variety of audio, data transmission, communication and telecommunication systems. However, there is no known circuit arrangement which achieves perfect transfer, or ideal coupling, of the source voltage to the load.

Known coupling circuits fail to achieve ideal coupling for several reasons. Firstly, the voltage source is connected to the load via a coupling medium which has a finite impedance at any given frequency, and which will therefore be responsible for a voltage drop. Secondly, a practical voltage source behaves like an ideal voltage source in series with a source impedance. Therefore, when current is drawn from such a source, there is a voltage drop across the source resistance.

It is known to minimize source-to-load voltage drops, or signal attenuation, by the provision of an active circuit, known as an amplifier stage, between the source and load circuits. When such a circuit is used, for example when an operational amplifier is used as a unity gain voltage follower, the ratio of load voltage, $V_L$, to source voltage, $V_i$, can be expressed as follows:

$$\frac{V_L}{V_i} = A_V \left( \frac{R_{IN}}{R_{IN} + Z_i} \right) \left( \frac{Z_L}{Z_L + R_{OUT}} \right) \quad (1)$$

Where $A_V$ is the open circuit voltage gain of the amplifier stage, $R_{IN}$ is the driving point input resistance of the amplifier stage, $R_{OUT}$ is the driving point output resistance of the amplifier stage, $Z_i$ is the source impedance, and $Z_L$ is the load impedance.

If $R_{IN}$ is much greater than the absolute value of $Z_i$, the absolute value of $Z_L$ is much greater than $R_{OUT}$, and $A_V$ is approximately equal to 1, the load-to-source voltage ratio will be almost equal to unity. An ideal amplifier will have a value for $R_{IN}$ approaching infinity, a value for $R_{OUT}$ approaching zero and a value for $A_V$ substantially equal to unity.

However, practical amplifiers, when connected as a unity gain voltage follower, or amplifier, which include bipolar emitter followers and MOSFET source followers, have characteristics which are far from ideal. Emitter followers typically establish driving point input resistances that are rarely larger than a few hundred kΩ and driving point output resistances that are rarely smaller than several tens of Ω. Additionally, their open circuit voltage gains are usually no better than 0.95. MOSFET source followers provide a reasonable approximation of an infinitely large driving point input resistance, but their output resistance can be of the order of 100 Ω. Moreover, the low frequency open circuit voltage gain of a MOSFET source follower can be as low as 0.75 and when compared with bipolar emitter followers, the frequency response of a MOSFET source follower is substantially inferior. Both of these types of followers have marginal high frequency response capabilities. In the case of an emitter follower circuit, the frequency response can also be significantly underdamped, which would promote circuit and system instability, particularly when the load is highly reactive.

When a signal source is coupled to a load having an impedance with a reactive component, the current through the load is out of phase with the voltage across the load. Conventional coupling devices, including conventional amplifiers and impedance buffers, can not supply the correct out-of-phase load current. As a result, when the load is reactive or has a reactive component, even the best coupling devices can not avoid distorting the signal across the load. Such distortion is particularly apparent during those portions of the signal cycle when the load current polarity is opposite to the load voltage polarity. Those in the art will recognize that the magnitude of the reactive component of a load impedance which will be undesirable is that which causes a load voltage distortion that measurably deteriorates the performance of the system in which the circuit is installed.

In addition, all coupling devices have some reactances, which may be undesired parasitic reactances, which will, in the prior art, unavoidably produce a time delay between the source voltage and the load voltage, as well as phase shifts within the coupling device which can lead to load voltage distortion.

Furthermore, in the operation of known coupling devices, input signal variations tend to induce power supply voltage variations. As a result, it has proven difficult to employ a single power supply to drive a plurality of coupling devices. This is not because the devices fail to meet specifications, but because they are not provided with the required power supplies; lead lengths, ground loops, and noise pickup degrade the power delivered to the device.

A typical electronic signal processing system is shown in FIG. 1. The amplifier symbol represents any signal processor, such as an amplifier, that accepts an input signal $v_s$ and delivers a corresponding processed signal $v_o$ to a load impedance represented by a resistance. The ground symbol represents signal, or system, ground. The signal processor requires operating power from voltages V+ and V−, which come through "lines" from "power supplies" +E and −E with respect to ground. The power supplies are not necessarily of equal voltage, and often one of them is absent.

In common practice, the signal processor (hereafter "amplifier") is created by an integrated circuit "chip designer", and then a "system designer" incorporates the amplifier and other devices into a system that has to meet certain requirements. The interface between the chip designer and the system designer is a data sheet that contains the specifications of the amplifier, which always include the assumption of ideal power supplies to be provided by the system designer. That is, with reference to FIG. 1, E and therefore V+ and V− are assumed to be ideal zero-impedance voltage sources at all frequencies of interest, and the power supply lines are likewise assumed to be ideal noiseless zero-impedance connections.

When the system designer does indeed provide such ideal voltages V+ and V− at the amplifier, he expects the voltage $v_o$ delivered to his system load to be within the amplifier specifications. For example, a square wave input $v_s$ would deliver a rounded square wave $v_o$ according to the bandwidth specification of the amplifier, as in FIG. 1. As the amplifier "pulls" the load voltage $v_o$ above or below ground, the corresponding load current is drawn from the V+ and/or V− voltages and flows through the power supplies E as shown qualitatively in FIG. 2.

Such ideal performance, unfortunately, is rarely achieved: power supplies are nonideal, power supply lines are not zero-impedance, and noise (e.g. from "ground loops") can be injected into the power supply ground return. These nonidealities, and particularly the load current flowing in the nonzero line impedances, cause the amplifier output voltage to be distorted as indicated in FIG. 3, even when the signal processor is operating properly. It does not deliver specified performance simply because it is not being operated with the specified power supplies. This nonideality is often expressed in terms of "Power Supply Rejection Ratio", which ideally should be infinite, but in practice of course is not. In FIG. 3, as well as in FIGS. 4, 5 and 7, elements n represent noise sources and not actual signal sources.

This problem is well-known to system designers, whose usual "fix" is to place decoupling or "bypass" capacitors, as shown in FIG. 4, whose function is to filter the power supply voltage variations from V+ and V−, and to divert the load current from flowing in the nonzero line impedances, thus restoring essentially the specified amplifier performance.

Nevertheless, there are two (technical) limitations to this fix. First, the bypass capacitor, which is intended to be a zero impedance, is not ideal at both ends of the frequency spectrum: its finite capacitance causes it to be an infinite impedance at zero frequency, and it self-resonates at some high frequency at which it appears to be an "equivalent series resistance" (esr) and above which it behaves like an inductance (esl) causing it to be an infinite impedance also at infinite frequency. Indeed, often four capacitors are used instead of two to spread the desired low-impedance property over a wide enough frequency range.

Second, it is difficult to place the bypass capacitors physically close enough to the V+, V− terminals and system ground. This difficulty is greatly aggravated when, as often happens, system ground is some distance from the amplifier chip. As a result, the bypass capacitors actually perform as though they were tapped part way along the line impedances and noise source. Both of these technical limitations can be represented as in FIG. 5, from which it is obvious that the bypass capacitor fix can provide only limited improvement.

SUMMARY OF THE INVENTION

It is an object of the present invention to provide a circuit which may be used as an impedance buffer providing an extremely low distortion and attenuation factor between a voltage source and a load.

Another object is to provide a circuit of this type which approximates an ideal coupling medium to a greater degree than prior art amplifier circuits.

A further object of the invention is to provide an amplifier which can achieve near ideal coupling between a source and a load.

Still another object of the invention is to provide an amplifier which achieves near ideal coupling with a structurally simple arrangement of inexpensive components.

Yet another object of the invention is to achieve real time, broadband compensation of any voltage variation and/or current phase shift between a source and any load due to inherent electrical characteristics of the coupling circuit and of the transmission channel between the source and the load.

Another object of the invention is to achieve real time, broadband insensitivity to external stimuli which may alter or affect the transfer function of the amplifier circuit and/or the load and of any transmission line connected between the load and the amplifier circuit, such external stimuli including stray fields and noise.

Yet a further object of the invention is to achieve a real time, broadband improvement of the amplifier circuit gain/phase margin, in effect compensating for the effect of a pole internal to the amplifier circuit, thereby broadening the usable bandwidth of the amplifier circuit.

Another object of the invention is to achieve real time, broadband insensitivity to amplifier circuit layout, by compensating for stray reactances inherent in the physical layout of the amplifier circuit.

Another, and basic, object of the invention is to provide coupling devices from nonideal power supplies, by providing significant improvement in power supply rejection ratio, so that the anticipated specifications are preserved and system designers no longer have to derate devices.

The above and other objects are achieved, according to the invention, in a signal coupling circuit which includes: an input terminal for receiving an input signal from a source and first and second output terminals for supplying an output signal to a load; signal processing means connected between the input terminal and the first output terminal for deriving an output signal from the input signal and for supplying the output signal to a load connected between the output terminals; power supply means having a ground terminal; and connecting lines each having a finite impedance and connected for supplying operating power from the power supply means to the signal processing means, by the improvement comprising distortion eliminating means connected between the power supply means and the second output terminal for directing load current to the power supply terminals, whereby there is substantially no flow of load current to the power supply means ground terminal, thus bypassing the load current from said line impedances, the distortion eliminating means comprising at least one active circuit element and having an electric characteristic corresponding substantially to a capacitor with infinite capacitance.

Objects according to the invention are further achieved by a method for coupling the source to the load in the manner achieved by operation of the above-defined circuit.

The improvements according to the invention are thus achieved essentially by the provision of a circuit component between the point of connection of the signal source to the load and a d.c. power source, the circuit component being effective to eliminate, or suppress, virtually all causes of distortion in the signal coupled to the load.

BRIEF DESCRIPTION OF THE DRAWING

FIG. 12a is a circuit diagram showing a conventional coupling circuit and a coupling circuit according to the invention, both connected to a common input signal source.

FIG. 12b is a diagram of an equivalent circuit of conductors of the circuits of FIG. 12a.

FIGS. 13, 14 and 15 are diagrams showing waveforms produced in the operation of the circuits of FIG. 12a.

FIG. 16 is a diagram showing a further comparison between the circuits of FIG. 12a.

DESCRIPTION OF THE PREFERRED EMBODIMENTS

Figure 6:
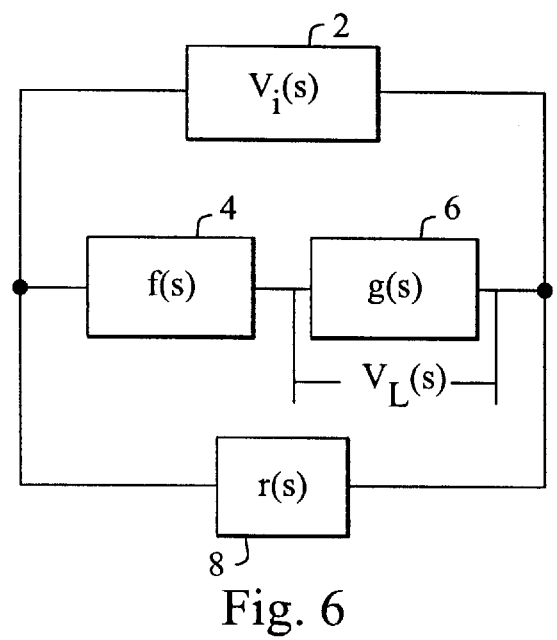
FIG. 6 is a block diagram illustrating a system for providing improved coupling in accordance with the present invention.

FIG. 6 is a block diagram illustrating a system which includes a voltage source 2, a load 6, and circuit components 4 and 8 for coupling the source to the load. Each block is represented by its Fourier transform, or frequency domain, function. Thus, voltage source 2 has the transfer function $V_i(s)$ and load 6 has the transfer function with the reactive component g(s). Conventional arrangements for coupling source 2 to load 6 would be composed of a circuit device as represented by block 4. According to principles known in the art, block 4 would be constructed to cause $V_L(s)$ to have a value as close as possible to $V_i(s)$ and to cause $V_i(s)$ to have a value as close as possible to the open circuit output voltage of source 2. However, it will unavoidably occur that the voltage coupling between source 2 and load 6 will be influenced by transfer functions with the reactive components f(s) and g(s), which will introduce some difference between the open circuit voltage provided by source 2 and $V_L(s)$.

In the prior art, efforts have been made to compensate for such difference by the provision of additional components which are capable of eliminating, or at least substantially reducing, that difference at a defined frequency.

According to the present invention, coupling unit 4 is supplemented by a waveform preservation, or compensation, element or unit 8 having the transfer function with the reactive component r(s), which is capable of substantially completely compensating for the influence of f(s) and g(s) on $V_L(s)$ over a broad frequency band. Specifically, this result will be completely achieved if:

$$r(s) = -[f(s) + g(s)].$$

The extent to which full compensation is approached is dependent on the extent to which complete equality is approached in the above-defined relationship.

Moreover, the signal frequency band over which full compensation is approached is dependent on the operating band widths of units 4 and 8. Accordingly, in preferred embodiments of the invention, unit 8 will be constructed to have an operating band width at least equal to that of unit 4.

Figure 1:
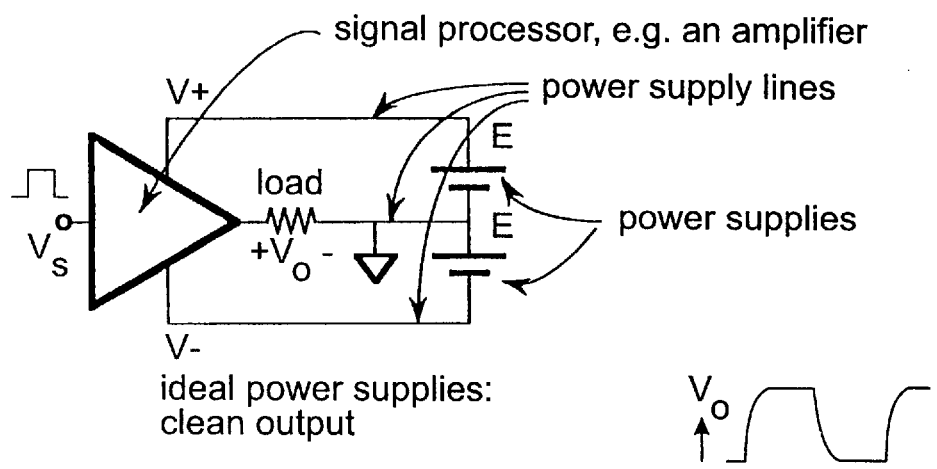
FIGS. 1, 2, 3, 4 and 5 are circuit diagrams showing various prior art coupling circuit configurations.
Figure 2:
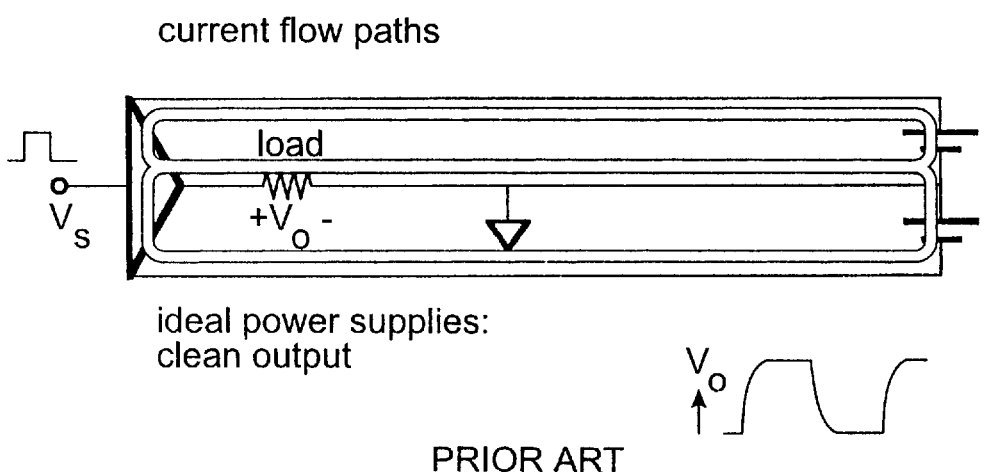
Figure 3:
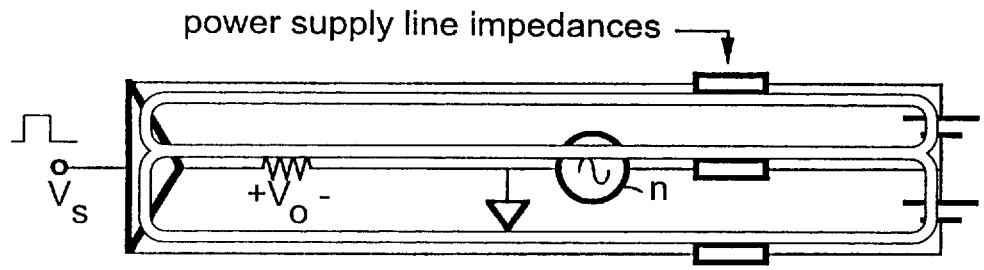
Figure 4:
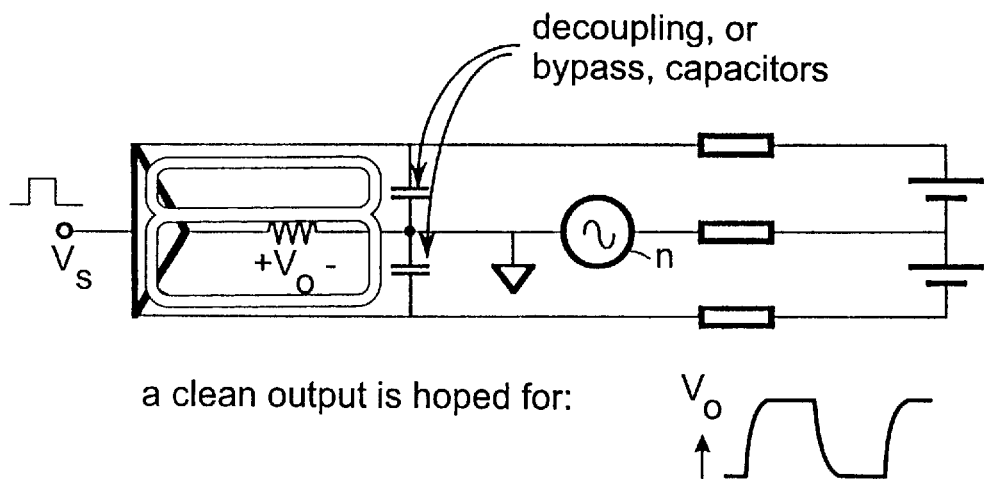
Figure 5:
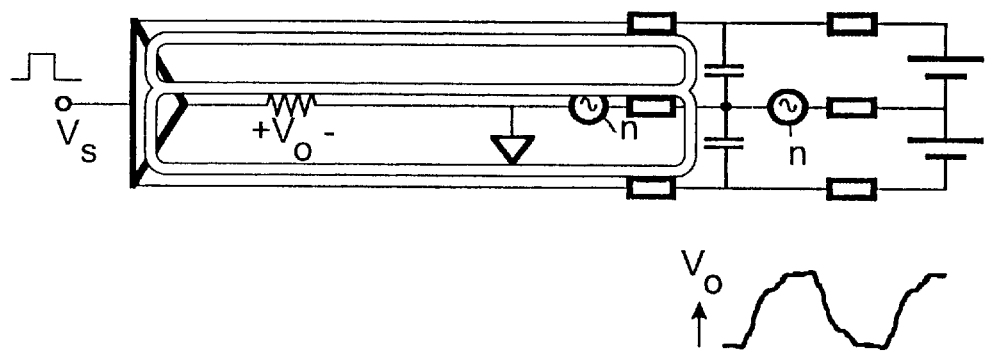
Figure 7:
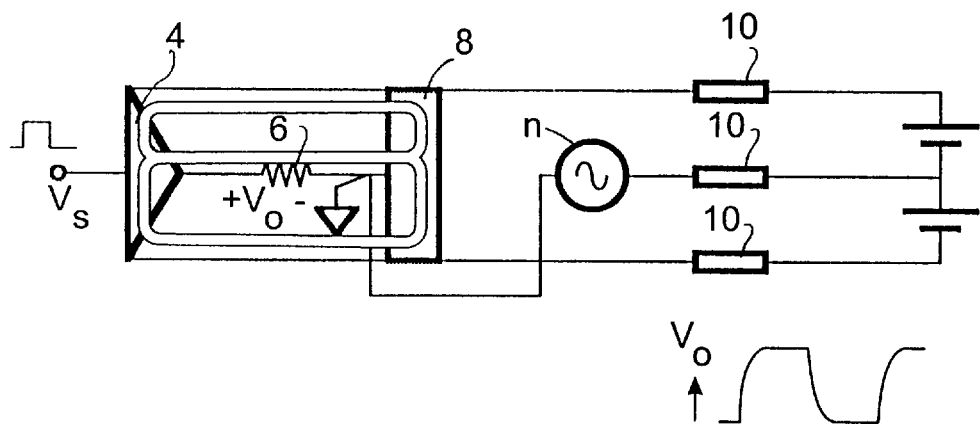
FIG. 7 is a simplified circuit diagram of a system according to the invention.

A circuit according to the invention, which can be described as a restoration circuit or preservation circuit, affords a significant improvement over the bypass capacitor fix. The circuit is connected at the same points as, and behaves essentially as, a pair of ideal infinite bypass capacitors, as shown in FIG. 7. Its function is to divert the load current from flowing in the nonzero line impedances 10, thus restoring essentially the specified amplifier performance.

The restoration circuit according to the invention behaves like ideal infinite bypass capacitors in providing a significant improvement in power supply rejection ratio, because its output impedance, through which the diverted load current flows, is as low as is that of the amplifier over the same frequency range.

Figure 8:
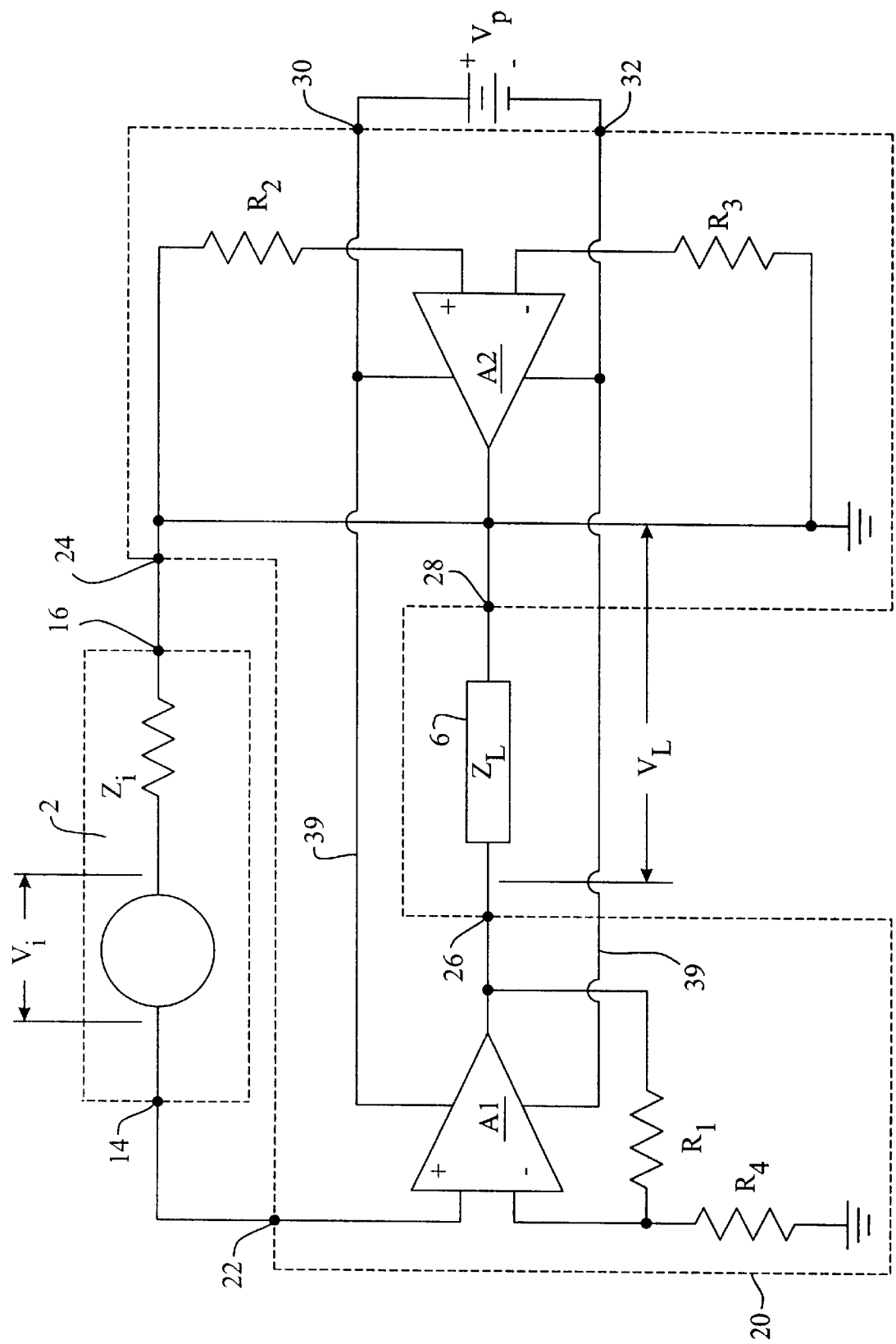
FIG. 8 is a circuit diagram illustrating a circuit according to the present invention, connected to a signal source and a load.

FIG. 8 is a circuit diagram of a preferred embodiment of an amplifier circuit according to the present invention coupling a voltage source 2 to a load 6 having an impedance $Z_L$ in such a manner that the voltage $V_L$ created across load 6 is substantially equal to the open circuit voltage $V_i$ from source 2.

Source 2 has two output terminals 14 and 16, terminal 14 being connectable to the noninverting input of a differential amplifier A1. The output of differential amplifier A1 is connectable to a first end of load 6 and to the inverting input of the same amplifier. In the illustrated embodiment, a feedback resistor $R_1$ is connected between the output of amplifier A1, and thus the first side of load 6, and the inverting input of amplifier A1 and a further resistor $R_4$ is connected between the inverting input of amplifier A1 and a point defining the reference potential for the circuit, here illustrated as ground. Amplifier A1 and resistors $R_1$ and $R_4$ here essentially correspond to device 4 of FIG. 6.

According to a particular novel feature of the invention, the amplifier circuit includes a second differential amplifier A2 whose output is connectable to both terminal 16 of source 2 and the second side of load 6. The noninverting and inverting inputs of amplifier A2 are connected via respective resistances $R_2$ and $R_3$ to the output of amplifier A2. Components A2, $R_2$ and $R_3$ essentially constitute unit 8 of FIG. 6.

Both amplifiers are preferably of a type having a high input impedance at each input, a low output impedance and a very high gain, which characteristics are provided by commercially available operational amplifiers.

The amplifier circuit is completed in a manner conventional for operational amplifiers, by a source of operating voltage, $V_p$.

According to preferred embodiments of the invention, amplifiers A1 and A2 are mounted in a housing 20 together with resistors $R_1$, $R_2$, $R_3$ and $R_4$, if such resistors are provided, and all of the conductors. The effective gain of amplifier A1, and hence the gain of the amplifier circuit, will be equal to quantity $$\frac{R_1 + R_4}{R_4},$$

or in other words, $$V_L = V_i \times \frac{R_1 + R_4}{R_4}.$$

Therefore, amplifier A1 can be configured as a unity gain voltage amplifier by making $R_4$ equal to $\infty$, i.e. by disconnecting the inverting input of amplifier A1 from the point at circuit reference potential. Associated housing 20 carries two input terminals 22 and 24, two output terminals 26 and 28 and two supply voltage terminals 30 and 32 which extend out of housing 20. Input terminal 22 is connected to the noninverting input of amplifier A1 and input terminal 24 is connected to the output of amplifier A2, while each of output terminals 26 and 28 is connected to the output of a respective one of amplifiers A1 and A2. Thus terminals 24 and 28 are shorted together. Operating voltage is supplied to both amplifiers A1 and A2 from terminals 30 and 32 via power supply conductors 39 and 39'.

Since source 2 is a voltage source, it can conventionally be thought of as a source of an EMF, $V_i$, and a series impedance $Z_i$. The voltage $V_i$ produced by source 2 would have an open-circuit value of $V_i$ and will decrease as the value of the impedance connected, external to source 2, between output terminals 14 and 16 decreases. However, with the amplifier circuit according to the present invention, the voltage $V_L$ imposed across load 6 will remain substantially equal to $V_i$ if amplifier A1 is configured as a unity gain voltage follower, nearly independently of the value of $Z_L$.

In an amplifier circuit connected as a unity gain voltage follower according to the invention, the resistance of resistor $R_1$ can have any value between 0 and a very large value. When the inverting input of amplifier A1 is isolated from ground, there will be virtually no current flow between the output and the inverting input of amplifier A1, so that the output and inverting input will be at the same voltage regardless of the resistance value of resistor $R_1$.

Resistances $R_2$ and $R_3$ will have low values and, according to preferred embodiments, will represent resistance values of zero ohms, i.e. both inputs of amplifier A2 are preferably conductively connected to the output of A2. The output of amplifier A2 may be connected to ground, but this is not essential. What is important is that the output of amplifier A2 provide the reference potential for both the source voltage and the load voltage, and a reference point from which to measure circuit performance. When the output of amplifier A2 is not connected to ground, the other side of resistor $R_3$ will be connected to the output of amplifier A2, but will also not be connected to ground.

When source 2 and load 6, as well as the operating voltage source, are connected as shown in FIG. 8, terminal 14 of source 2 is connected to the noninverting input of amplifier A1 and terminal 16 of voltage source 2 is connected to the output of amplifier A2. Thus, amplifier A1 is connected to operate as a voltage follower if $R_4 = \infty$. Load 6 is connected between the outputs of amplifiers A1 and A2.

With the illustrated connection arrangement, it might be thought that amplifier A2 would have no influence on the relation between $V_i$ and $V_L$. However, it has been found that, even when the inputs of amplifier A2 are connected to the output of A2 (the circuit reference point), amplifier A2 has the effect of causing the coupling between $V_i$ and $V_L$ to approach more closely an ideal coupling condition.

More specifically, amplifier A2, with its associated components, generates, or provides, the complex restoration function reactive component r(s), which has the value $-[f(s)+g(s)]$ in the equation $V_i(s)+Af(s)+g(s)+r(s)=V_L(s)$, where $V_i(s)$ and $V_L(s)$ are the frequency domain voltages provided by source 2 and generated across load 6, respectively and A is the amplifier circuit closed loop gain determined by $(R_1+R_4)/R_4$.

Each one of amplifiers A1 and A2 may be a single stage or a multistage operational amplifier. The advantage of using single stage operational amplifiers, as opposed to multistage operational amplifiers, is, in general, broader amplifier and system bandwidth. A single stage configuration also offers the advantages of circuit simplicity, with the attendant reduction in manufacturing problems, and a circuit topology which requires little compensation for broadband operation.

It should be noted that the driving point input resistance of amplifier A1 need not be extremely high to achieve a large system input resistance, given the fact that the inverting input terminal of amplifier A1 may not be returned to ground through a finite impedance if the circuit is configured as a unity gain voltage follower. Thus, the signal source is tied to a subcircuit that is effectively composed of the series combination of the driving point input resistance and, at least at low frequencies, the effective open circuit existing between the amplifier inverting input terminal and ground.

According to other embodiments of the invention, the outputs of amplifiers A1 and A2 can be connected in series with switches for controlling the connection of the output of each differential amplifier A1 and A2 to a respective end of load 6. Such switches may be employed for connecting a plurality of different loads in any desired sequence between the outputs of amplifiers A1 and A2.

Since the value of $V_L$ is virtually independent of the value of $Z_L$, the load voltage will not be affected even when the value of $Z_L$ is varying periodically or intermittently. Moreover, the value of $V_L$ will be the same for any value of $Z_L$ between purely resistive and highly reactive.

To employ an amplifier according to the invention with a signal source 2 which has one terminal grounded, the ground side of such source could be coupled to terminal 24.

While an amplifier circuit according to the invention can be connected to a floating signal source and a floating ground, and this can prove highly advantageous in certain cases, the amplifier circuit may be connected between a signal source and a load which are connected to a common ground.

It is anticipated that if an amplifier circuit according to the present invention were implemented as a monolithic integrated circuit, the cost of such circuit will be extremely low, and frequency related effects will be sharply diminished.

In view of the ability of a circuit according to the present invention to generate, in real time, the complex function reactive component r(s) which is most nearly equal to $-[f(s)+g(s)]$, a circuit according to the invention has been found to be ideally suited for transferring signals from a signal source to a load, particularly when the load is coupled to the output of one or both amplifiers by a transmission path having a complex transfer function.

The complex function reactive component r(s) is generated in real time and automatically by the circuit shown in FIG. 8. Furthermore, the real time generation of the complex function reactive component r(s) makes the overall amplifier circuit, which performs as a type of complex function generator, insensitive to real time disturbances in the transfer function reactive component f(s) of the coupling member and the transfer function reactive component g(s) of the load, provided that such disturbances are within the dynamic voltage, current and frequency ranges of the circuit. These ranges constitute what is here identified as the compliance region of a practical embodiment of a circuit according to the present invention.

The operating characteristics of a circuit according to the present invention, particularly in view of the action produced by amplifier A2 and its associated elements, enable the output voltage $V_L$ to be an extremely accurate representation of the voltage $V_i$, whether or not $V_L$ is an amplified version of $V_i$. In other words, the autocorrelation of $V_i(s)$ to $V_L(s)$ will approach an optimum value, virtually independently of the selected circuit gain or any amplifier circuit and transmission line propagation delays which exist.

The principle underlying the operation of circuits according to the present invention, as presently understood, will now be described in greater detail with reference to FIG. 9, which illustrates a simplified equivalent circuit of a specific embodiment of a circuit according to the invention. The embodiment shown in FIG. 9 corresponds to the components shown within housing 20 in FIG. 8, except for resistors $R_1$–$R_4$. When the embodiment shown in FIG. 9 is employed, resistors $R_1$ and $R_4$ may be connected in the manner shown in FIG. 8, while resistors $R_2$ and $R_3$ will be eliminated.

Figure 9:
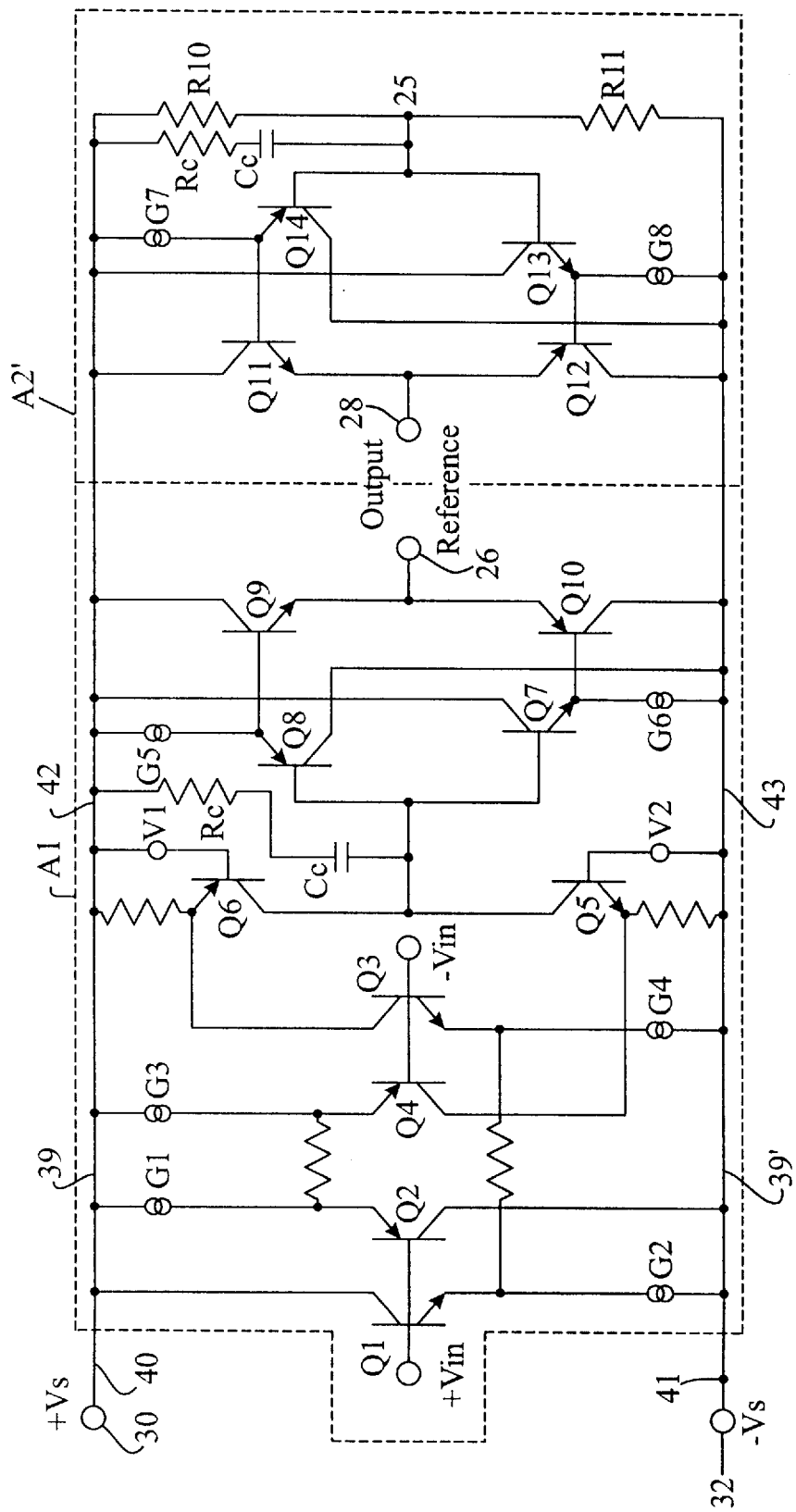
FIG. 9 is a detailed circuit diagram illustrating a preferred embodiment of the circuit according to the present invention.

In FIG. 9, operational amplifier A1 may be a model HFA0005 amplifier manufactured and marketed by the Harris Corporation. This amplifier will be connected to a source and load in the manner shown in FIG. 8.

It has been found that the unit 8 of FIG. 6 need not be constituted by a complete operational amplifier and can be constituted by the output stages of such an amplifier, i.e. the amplifier gain stages are eliminated. In the embodiment shown in FIG. 9, operational amplifier A2 is replaced by a circuit arrangement A2' composed of transistors Q11–Q14, current sources G7 and G8 and resistors R10 and R11. Transistors Q11–Q14 and current sources G7 and G8 form a circuit arrangement which is identical to the portion of the output stage of operational amplifier A1 constituted by transistors Q7–Q10 and current sources G5 and G6 and may be constituted by that portion of the output stages of the model HFA0005 amplifier. According to the invention, output stage transistors Q5 and Q6 of amplifier A1 are replaced in arrangement A2' by resistors R10 and R11, which are connected in series between the positive and negative operating power supply terminal 30 and 32 and are connected at their point of connection to the bases of transistors Q13 and Q14. It is presently believed that resistors R10 and R11 should have identical resistance values, if a symmetrical output voltage or current swing is desired. Since arrangement A2' does not act as an amplifier, resistors R10 and R11 provide a circuit simplification without altering the behavior of the preservation unit. Arrangement A2' according to the invention could contain output stage components such as transistors Q5 and Q6, their associated emitter resistors, and voltage sources V1 and V2, as shown for amplifier A1 in FIG. 9, in place of resistors R10 and R11.

The two bipolar output transistors Q11 and Q12 have their emitters connected together and to output 28. The collectors of transistors Q11 and Q12 are connected to respective ones of supply voltage terminals 30 and 32.

Each of transistors Q13 and Q14 has its collector-emitter path connected, in series with a respective current source G7 or G8, between supply voltage terminals 30 and 32. The base of transistor Q11 is connected to the emitter of transistor Q14 and the base of transistor Q12 is connected to the emitter of transistor Q13.

Transistors Q11 and Q12 constitute a complementary transistor pair whose emitters are connected to the point 28 which is the common terminal for the input and output signals. Transistors Q13 and Q14 are complementary to one another, transistors Q9, Q11 and Q13 are of a first conductivity type and transistors Q10, Q12 and Q14 are of the opposite conductivity type.

A key to the significant advance provided by the present invention resides in the separation of output voltage control and output current control. Output voltage control is provided by operational amplifier A1 which operates, when connected in the manner shown in FIG. 8, as a conventional voltage follower to cause $V_L$ to follow $V_i$.

According to conventional practice, an amplifier, a typical example of which is amplifier A1 of FIG. 8, would be connected by itself to source 2 and load 6, as shown in FIG. 8, and would operate as follows. If load 6 is essentially purely resistive, the current output from the amplifier will be, to a substantial degree, directly proportional to the output voltage and inversely proportional to the load resistance. The output stage of the amplifier can supply the required current within the normal limits of internal impedance, slew rate, etc. However, even with a purely resistive load, a coupling device such as amplifier A1 will, because it contains reactances which can not be eliminated, produce phase shifts between $V_i$ and $V_L$ and introduce waveform distortions in $V_L$, particularly at higher frequencies.

If the load is not purely resistive, i.e., if it has a capacitive or inductive component, or is essentially capacitive or inductive, such that the load has a complex or a reactive impedance, then current flow through the load will no longer be in phase with the voltage across the load. As a result, a certain degree of distortion will be introduced into the output voltage. Whenever the load current is out of phase with the load voltage, there will be times during each signal cycle when the polarity of the load current will have to be opposite to the polarity of the load voltage if the load voltage is not to be distorted. During those times when the current and voltage are to have respectively opposite polarities, a conventional amplifier can no longer supply the correct current and even greater waveform distortion occurs in the load. There is, however, a small current region near zero current when a very small amount of out-of-phase current can flow, but this capability of existing amplifiers is quite limited.

The preservation unit 8, constituted in the embodiment of FIG. 8 by amplifier A2 and resistors R2 and R3, and in the embodiment of FIG. 9 by the output stage components Q11–Q14, G7 and G8 along with resistors R10 and R11, provides the separate output current control which will supply the current required by load 6 to maintain the desired voltage waveform between terminals 26 and 28 despite the presence of reactances in amplifier A1 and/or a load 6 whose impedance has a reactive component.

One salient feature of circuits according to the invention is that, referring to FIG. 9, the signal common, or reference, corresponding to terminal 28, is not referenced to the ground shared by the power supply, and the potential at point 28 can differ from the potential at point 25 between resistors R10 and R11.

With the addition of a waveform preservation, or compensation, unit 8 (e.g. A2 or A2') in accordance with the present invention, the operation of the system changes, although amplifier A1 continues to control the voltage across load 6 in dependance on $V_i$.

When $V_i$ has a value of zero, the reference potential at terminal 28 is essentially midway between the potentials +Vs and −Vs created by supply source $V_p$ at terminals 30 and 32, respectively. The potential at point 25 always has a fixed relation to the potentials on conductors 39 and 39'. At least when R10=R11, transistors Q13 and Q14 and current sources G7 and G8 act to cause the potential at point 28 to be equal to the potential at point 25 when $V_i$=0.

However, when $V_i$ has a non-zero value such that a current flows through at least partially reactive load 6, the voltage at terminal 28 varies with respect to that at point 25 between resistors R10 and R11 in accordance with the magnitude of current flow. While this variation occurs, point 25 continues to have a fixed potential relative to the supply voltage potentials. Thus, point 25 constitutes a virtual ground while point 28 corresponds to the actual circuit ground in that point 28 is common to one end of load 6 and one end of voltage source 2; it is point 28 which is connected to system ground, when connection of the circuit to system ground is desired. But, at least when point 28 is connected to system ground, the source of operating voltage $V_p$ will not be connected to ground. The voltage between points 28 and 25 will then vary in accordance with the voltage drop expected across a pn junction in response to the current flowing through load 6.

As the potential at point 28 varies with respect to that at point 25, the potential at point 26 also varies by the same amount with respect to that at point 25 because the voltage between points 26 and 28 maintains a fixed relation to $V_i$. With respect to point 25, the potential at output point 26 is equal to the sum of the output voltage $V_1$ and the potential at point 28. Thus, the potential at output 26 changes with respect to the supply voltage potentials +Vs and −Vs, causing a change in the bias and operating points of transistors Q9–Q12.

Specifically, the alternating voltage across the load causes the potential at terminal 28 to shift relative to the potentials at the collectors of transistors Q11 and Q12, as well as at the collectors of transistors Q9 and Q10. These potential shifts will have the following effects, when load 6 has at least a reactive component:

during parts of the signal cycle when the load current and load voltage must have the same polarity, the operating points of the currently conducting one of transistors Q9 and Q10 and that one of transistors Q11 and Q12 which is of the opposite conductivity type are shifted to produce the correct current flow between conductors 39 and 39' and through load 6. For example, during the voltage half-cycle during which transistor Q9 is being driven into conduction, transistor Q12 will also be conductive; and during those parts of the signal cycle when the load current and the load voltage must have respectively opposite polarities, the resulting shifts in the potentials at points 26 and 28 relative to point 25 will additionally drive the other two transistors, i.e. in the example described above transistors Q10 and Q11, into conduction to supply the required opposite polarity current.

In addition, if load 6 could, under existing signal conditions, be considered purely resistive, the circuit according to the invention will eliminate output voltage phase shifts and distortion that would otherwise be caused by reactances in amplifier A1. In this case, because of the effect of those reactances, the potentials at points 26 and 28 will shift to set the operating points of the conductive output transistors, i.e. either Q9 and Q12 or Q10 and Q11, to produce the load current flow needed to compensate for such reactances.

The biassing of transistors Q9–Q12 will automatically be at the levels required to generate the correct current flow.

In particular, the potential at point 26 relative to point 25 varies in a manner to follow, or conform to, the current demand. When considered with respect to point 25, the voltage of point 26 appears to be precisely in phase with the current, when the required current is flowing and as long as the circuit according to the invention is operating within its compliance limits. Current technology enables such compliance limits to be quite large.

Thus, the operation of the waveform preservation unit according to the invention to supply the required current level is relatively decoupled from the operation of the voltage control section, constituted essentially by amplifier A1. Current control is achieved by shifting the potential at reference point 28 and thus also at output point 26, relative to the supply voltage potentials +Vs and −Vs.

It has been found that a circuit according to the invention will eliminate virtually all distortion in the load current waveform, relative to the source signal voltage waveform, over substantially the entire design bandwidth of the coupling device, even for those periods when the desired load current polarity is opposite to the desired load voltage polarity. Moreover, the circuit according to the invention eliminates virtually all phase shift between the source voltage and the load voltage which would otherwise be caused by the load reactance and by reactances, including parasitic reactances, within the coupling device itself, i.e. within amplifier A1 of FIGS. 8 and 9. Reactances within the preservation unit i.e. A2 in FIG. 8 and Q11, Q14, G7, G8, RIO and R11 in FIG. 9, will not have any influence on circuit operation within the compliance region of the preservation unit, which region can be made to correspond to the design bandwidth of the coupling device.

In addition, the circuit according to the invention will effectively suppress crosstalk from adjacent circuits within the signal bandwidth of the circuit.

For many applications, it is not desirable to have the voltage at the signal reference point 28 vary with respect to the power supply potentials because this could interfere with the possibility of driving a plurality of circuits according to the present invention with a single power supply. Thus, if it is desired to have a plurality of circuit devices driven by a common power supply and share the same signal reference point 28, it is possible to provide each device with an internal floating power supply that is effectively decoupled from the main, external, supply.

Figure 10:
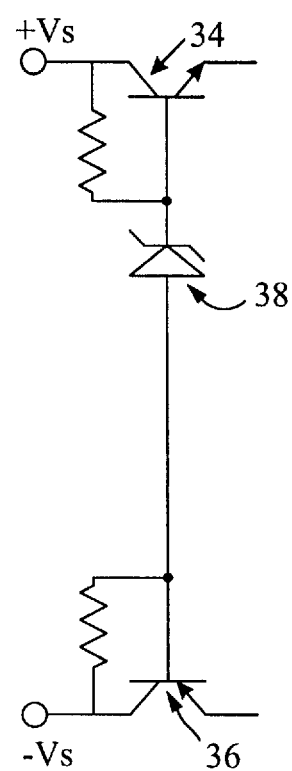
FIG. 10 is a circuit diagram illustrating a supplemental circuit unit which can be added to the circuit of FIG. 9.

One circuit arrangement for achieving this result, according to the present invention, is shown in FIG. 10. This arrangement includes two transistors 34 and 36, each having its collector connected to a respective power supply terminal. A Zener diode 38 is connected between the bases of transistors 34 and 36, with a respective biasing resistor being connected between the base and collector of each transistor 34, 36. Transistors 34 and 36 are thus connected in a common base configuration and can isolate the power supply conditions of one circuit from that of the other circuits. In the circuit arrangement shown in FIG. 10, it will be noted that transistors 34 and 36 are complementary to one another.

To employ the arrangement of FIG. 10 in the circuit of FIG. 9, the power supply conductors 39 and 39' of the circuit of FIG. 9 may be broken at points 40 and 41, the emitters of respective transistors 34, 36 will be connected to respective points 40 and 41 and the collectors of transistors 34, 36 will be connected to terminals 30 and 32, respectively. Alternatively, the conductors could be broken at 42 and 43 and the collector-emitter path of each transistor 34, 36 may be inserted at that point in a respective conductor. +Vs and −Vs could continue to be supplied at any point of each supply conductor to the left of transistors 34 and 36. In general, transistors 34, 36 may be inserted into conductors 39 and 39' at any points to the left of the connection points of the collectors of transistors Q9 and Q10. Therefore, the collectors of transistors Q9 and Q11 will always be at the same potential, as will the collectors of transistors Q10 and Q12.

Zener diode 38 provides a reference voltage to establish the actual regulated supply voltage within a respective circuit. Transistors 34 and 36 conduct the operating current needed by the circuit portion downstream thereof.

With the circuit arrangement of FIG. 10, there is no fixed power supply ground for circuit portions to the right of transistors 34, 36 in FIG. 9. The difference between the positive and the negative power supply potentials within a device is controlled by Zener diode 38, but the potentials on the power supply lines within the circuit are free to float with respect to the potentials +Vs and −Vs. Therefore, the main external power supply may itself have a center ground, while supplying power to a plurality of circuits such that in each circuit, the potential at point 25 may shift relative to system ground.

Since the internal power supplies are decoupled from one circuit to another, the potentials at points 25 of respective circuits can vary relative to one another, even if points 28 of all circuits are conductively connected together. As a result, a group of such circuits may be connected together like conventional buffers while the benefits of the present invention are retained.

The embodiment described thus far operates to maintain identity between the waveform of the voltage, $V_L$, across the load and the waveform of the signal voltage, $V_i$. However, there are circuit applications in which it is desirable to cause the waveform of the current through the load to be identical to the signal voltage waveform. An embodiment of the invention for achieving this relationship is illustrated in FIG. 11.

Figure 11:
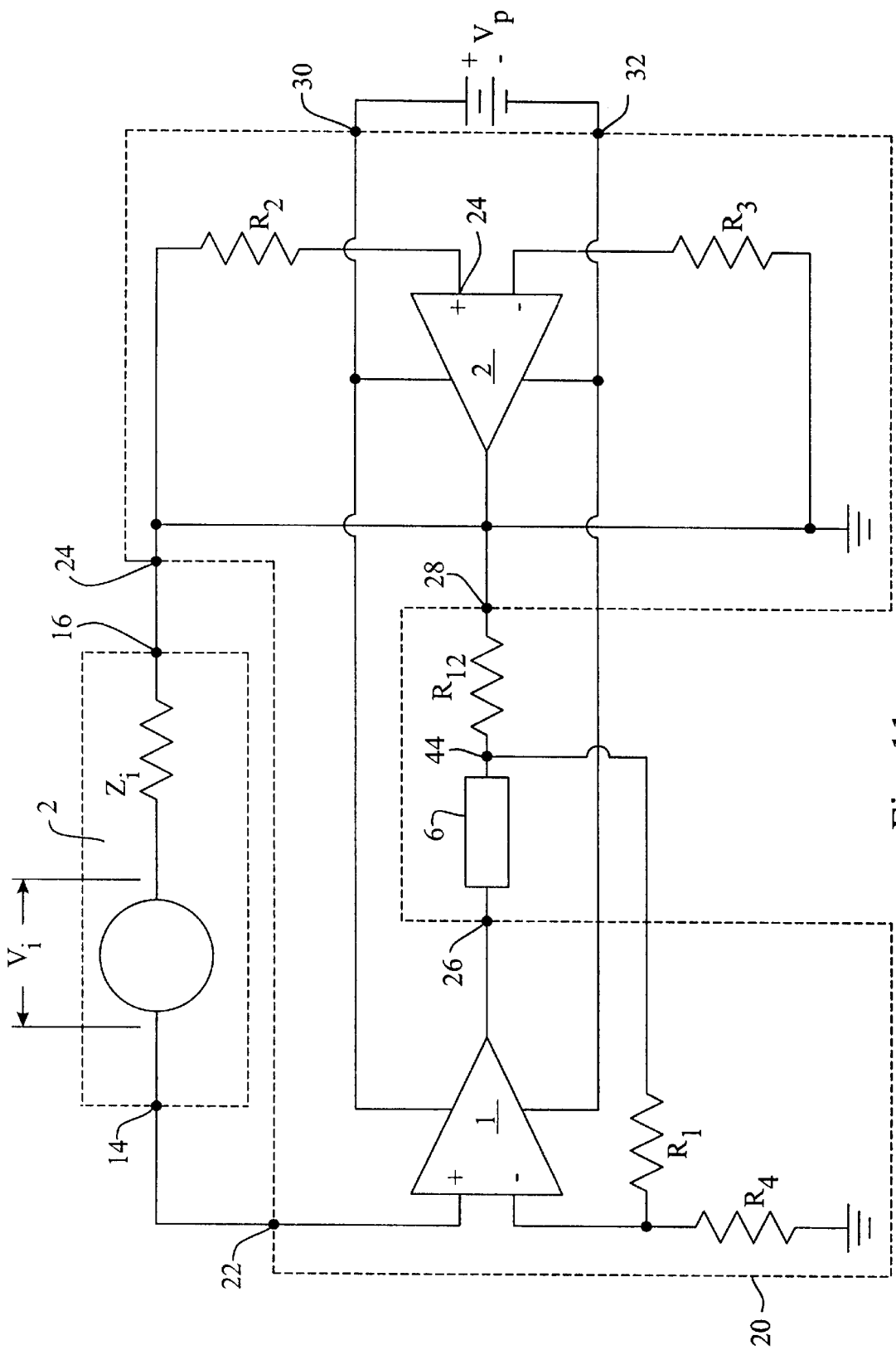
FIG. 11 is a circuit diagram similar to that of FIG. 8 illustrating a further embodiment of a circuit according to the invention for driving a reactive load in a manner to cause the current through the load to have a waveform identical to that of the signal source voltage.

The circuit shown in FIG. 11 corresponds substantially to that of FIG. 8 and the identical portions of the circuit of FIG. 11 will not be described again. The circuit of FIG. 11 differs from that of FIG. 8 in that a further resistor $R_{12}$ is interposed between load 6 and reference terminal 28 and the feedback path to the inverting input of amplifier A1 is connected to the point of connection 44 between load 6 and resistor $R_{12}$.

In the operation of the arrangement shown in FIG. 11, the voltage across resistor $R_{12}$ will be made to follow $V_i$. Since the voltage across a resistor is always in phase with the current through the resistor, the waveform of the current flow through resistor $R_{12}$ will be identical to the waveform of $V_i$. The resistance of resistor $R_{12}$ will be one or several ohms, while the resistance of resistor $R_4$ will be substantially higher, typically one kilohm or higher. Therefore, with resistor $R_{12}$ connected in series with load 6, the current through load 6 will be substantially identical to the current through resistor $R_{12}$.

The resistance value of resistor $R_{12}$ may be selected on the basis of the desired relationship between $V_i$ and the current through load 6.

Correspondingly, in the embodiment shown in FIG. 9, load 6 and resistor $R_{12}$ would be connected in series between terminals 26 and 28 and point 44 would be connected, via resistor $R_1$, to the base of transistor Q3.

Figures 12A, 12B:
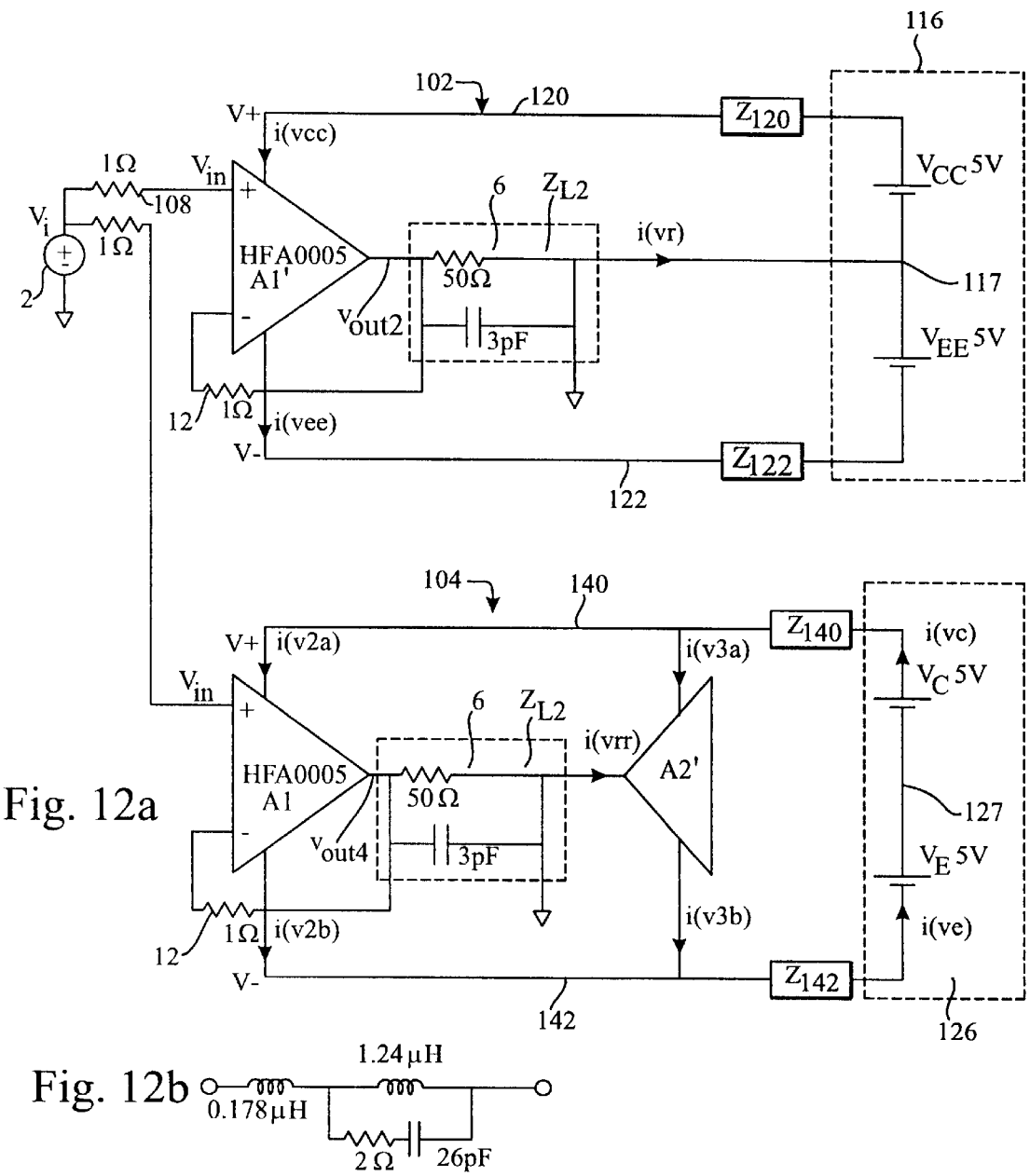

FIG. 12a is a diagram of two amplifier, or buffer, or coupling, circuits 102 and 104 connected to a common signal source 2 providing a signal $V_i$ which is represented by a potential relative to ground. Circuit 102 is composed essentially of a buffer device A1', here an operational amplifier having its noninverting input connected to the output of source 2 via a resistor 108. The output of amplifier A1' is connected to its inverting input via a feedback resistor 12. Amplifier A1' may be connected so that circuit 102 operates as a unity gain coupling, or buffer, circuit.

Operating power is supplied to amplifier A1' in the conventional manner from a d.c. source 116 here represented, for purposes of illustration, by sources of d.c. voltages $V_{CC}$ and $V_{EE}$. These two d.c. voltage sources are connected in series aiding and are poled to provide amplifier A1' with the proper operating power.

D.C. source 116 is connected to amplifier A1' via connecting lines 120 and 122, having respective inherent line impedances $Z_{120}$ and $Z_{122}$ shown here by lumped elements.

A load 6 having an impedance $Z_{L2}$ is connected between the output of amplifier A1' and ground. In the illustrated example, load 6 is represented electrically by a resistor connected in parallel with a capacitor. Load 6 can have an impedance represented by any other usable equivalent circuit. The point of connection 117 between the sources of the d.c. voltages $V_{CC}$ and $V_{EE}$ is also connected to ground.

Circuit 102 is a conventional operational amplifier circuit and is included in FIG. 12a to permit a direct comparison with a circuit 104 according to the invention, and to show how circuits 102 and 104 may be connected for purposes of accurately comparing their operating characteristics.

With regard to circuit 102, factors which are of relevance to the present invention are that amplifier A1' receives operating power from two amplifier power supply terminals which provide voltages V+ and V−, and amplifier A1' is connected to deliver to load 6 a signal $v_o$, or $v_{out2}$, which bears a direct relation to an input signal $v_{in}$, but is not related, subject to certain limitations, to the power supply voltages V+ and V−. Other features not significant in the present context, but chosen for example are that the load is shown as a 50Ω resistance in parallel with a 3 pF capacitance returned to signal ground, the operating power is derived via three power supply lines from two voltage sources which supply a positive voltage $V_{CC}$ and a negative voltage $V_{EE}$, respectively, with respect to signal ground, corresponding to point 117. In the illustrated circuit, in a computer simulation of the circuitry of FIG. 12a, $V_{CC}=V_{EE}=5V$. In circuit 102, negative feedback is taken from the output of amplifier A1' to the inverting input of that amplifier in a standard "unity gain" configuration.

Amplifier A1' in FIG. 12a could be any analog signal processing circuit. However, for computer analysis purposes, a Harris Corp. HFA0005 opamp was chosen. A simplified equivalent circuit model is shown in block A1 in FIG. 9, although a more detailed model was used in pSPICE v5.4 computer calculations that were performed to help analyze the capabilities of the present invention.

Computer analysis shows that the HFA0005, in the circuit of FIG. 12a with the line impedances set to zero, delivers a frequency domain gain magnitude that is flat at 0 dB and falls off smoothly as frequency increases, being 3 dB down at 280 MHz. Likewise, the response to a step input with 2.5 ns rise time is an almost identical step with no significant overshoot or ringing. These responses are the ideal "data sheet" responses that a designer would expect from the HFA0005 in the circuit of FIG. 12a with zero line impedances.

Unfortunately, such ideal performance is not achieved in real systems because the operating voltages V+ and V− delivered to the amplifier are not produced by the constant, zero-impedance sources represented in circuit diagrams like FIGS. 7 and 8. Specifically, these voltages are supplied from sources such as source 116 of FIG. 12a, via lines having finite impedances, such as the impedances $Z_{120}$ and $Z_{122}$ shown in FIG. 12a. Two undesirable consequences occur. First, an amplifier power supply terminal voltage variation causes a corresponding variation to appear in the amplifier output because the amplifier does not have an infinite "power supply rejection ratio" (PSRR). Second, the finite, or nonzero, power supply line impedances carry normal signal currents from the amplifier that develop additional amplifier power supply terminal voltage variations, which again show up in the amplifier output because of noninfinite PSRR.

To illustrate the effect of nonzero power supply line impedances, the amplifier circuits of FIG. 12a are provided with the line impedances $Z_{120}$ etc, in both the positive and negative power supply lines. These impedances have element values chosen to exaggerate their deleterious effect.

In accordance with the invention, circuit 104 further includes device A2', referred to herein as a restoration, or preservation, circuit. Device A2' may be constituted by a conventional operational amplifier or the output stage thereof. A simplified equivalent circuit of device A2', as an output stage of an HFA0005 amplifier, is shown in FIG. 9. If device A2' is replaced by a complete operational amplifier A2, its inputs should be shorted together.

In circuit 104, buffer device A1 and feedback resistor 12 are identical to, and are connected in the same manner as, device A1' and resistor 12 of circuit 102. Similarly, output load 6 of circuit 104 is identical to, and is connected in the same manner as, load 6 of circuit 102. Operating power is supplied to operational amplifier A1 in the conventional manner from a d.c. source 126 here identical to source 116 and represented, for purposes of illustration, by sources of d.c. voltages $V_C$ and $V_E$. These two sources of d.c. voltages are connected in series aiding and are poled to provide devices A1 and A2' with the proper operating power.

Source 126 is connected to amplifier A1 via connecting lines 140 and 142 having respective inherent line impedances $Z_{140}$ and $Z_{142}$, here represented by lumped elements, identical to lines 120 and 122 and impedances $Z_{120}$ and $Z_{122}$, respectively.

FIG. 12a shows exemplary values for the passive circuit components and d.c. supply voltages $V_{CC}$, $V_{EE}$, $V_C$ and $V_E$. These are chosen on the basis of the operating requirements of devices A1', A1 and A2'. Devices A1' and A1 may be constituted by Harris HFA0005 operational amplifiers and device A2' may be the output stage of a Harris HFA0005 operational amplifier, solely by way of example. To achieve an optimum improvement according to the invention, device A2 or A2' should have a bandwidth characteristic at least as good as that of device A1. To this end, circuit 104 may include a device A2 that can be identical to device A1 or a device A2' identical to the output stage of device A1.

Loads 6 may have virtually any impedance value. Indeed, the improvements achieved by the invention becomes more pronounced for highly reactive loads. In FIG. 12a, identical loads are provided to permit accurate comparison of the operation of circuits 102 and 104.

Although each connecting line 120, 122, 140 and 142 would ideally be purely conductive and simply supply operating power without attenuation or phase shift to associated devices, in practice these lines behave as complex impedances, particularly when high frequency signals are being coupled. FIG. 12b shows an equivalent circuit of an exemplary line, the circuit configuration and component values having been obtained by direct measurement of a lab dual power supply as seen at the end of a three-foot length of wire. This line impedance model was selected to enable the effect of line impedance to be demonstrated more clearly. Smaller or less reactive line impedances will produce effects which differ in magnitude but not in kind.

Figure 13:
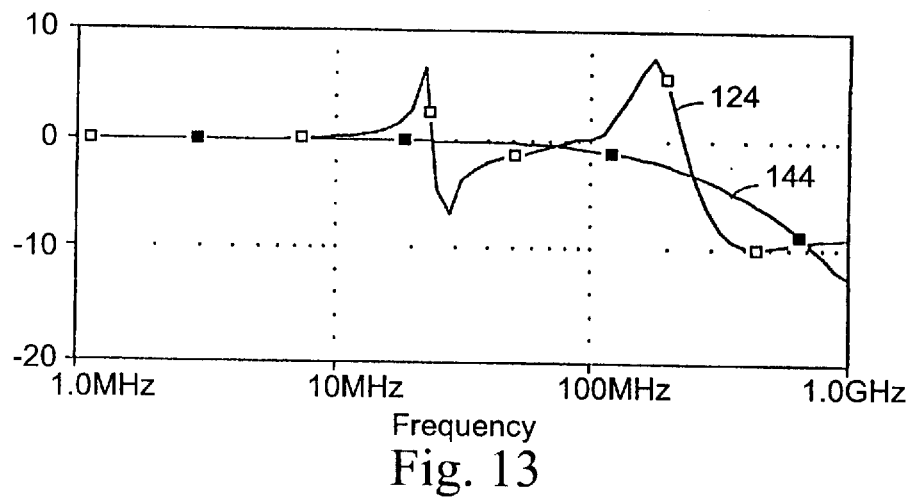
Figure 14:
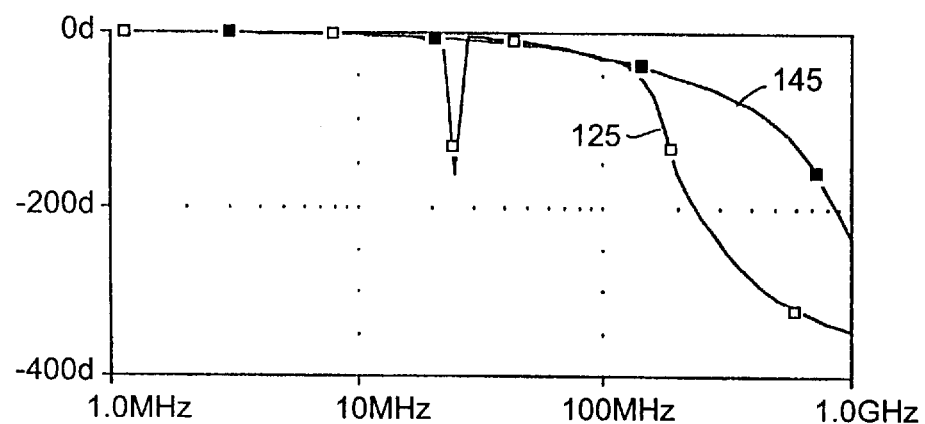
Figure 15:
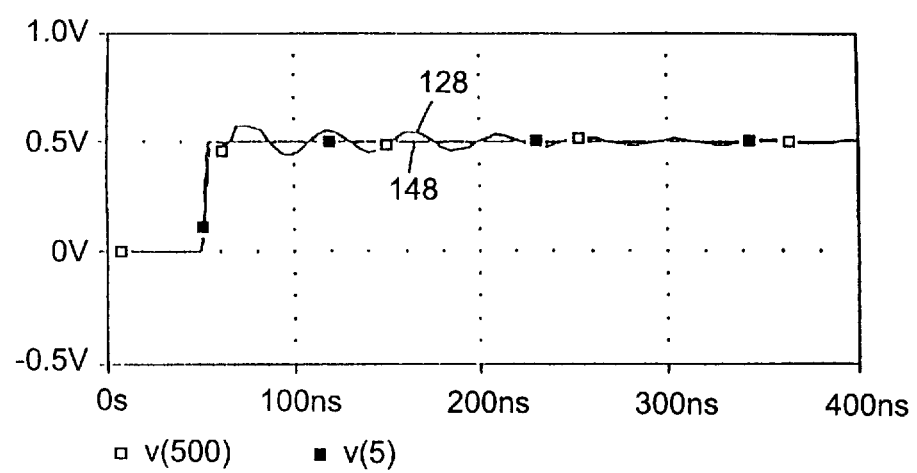

The performance of circuits 102 and 104 was analyzed on the basis of a computer model utilizing the Macintosh® version of the program pSPICE™v5.4. Results of these analyses are shown in FIGS. 13, 14 and 15. Curves 124, 125 and 128 show the results for circuit 102, curve 128 representing $v_{out2}$, while curves 144, 145 and 148 show the results for circuit 104. In FIG. 14, curve 145 represents the phase shift $(\phi_{out}-\phi_{in})$ between input and output voltage, i.e. $v_{in}$ and $v_o$. and in FIG. 15 curve 148 represents $v_{out4}$. Considerable distortion due to the line impedances is evident in both the frequency response and the step response for circuit 102. However, the aforementioned ideal "data sheet" responses are essentially restored by the addition of the restoration circuit device according to the invention in circuit 104 of FIG. 12a, even though the nonzero line impedances are still present.

The embodiment of arrangement A2' according to the invention that achieves the desirable results of FIGS. 13–15 is shown in FIG. 9. This embodiment is seen to be the same as the output stages of the HFA0005 chosen for the present example. In general, the essential feature of the restoration circuit according to the invention is that it be similar to the output stages of whatever amplifier is used in the conventional configuration.

The interpretation of the results of FIGS. 13–15 is as follows. In the presence of an input signal, the amplifier supplies current to the load which, in the conventional circuit 102 of FIG. 12a is returned via the power supply center tap 117, through the power supply voltage sources, and back to the amplifier power supply terminals. If there were no impedance in the power supply lines, so the load currents in them develop no voltage drops so there is no variation of the voltages V+ and V− supplied to the amplifier, and the amplifier output is the "data sheet" result of curves 144, 145 and 148 of FIGS. 13–15. In circuit 102 of FIG. 12a, the load current returning to the amplifier through the power supply lines develops voltage drops across the nonzero line impedances, which cause variations in the voltages V+ and V− supplied to the amplifier, and the amplifier output displays the severe distortion shown by curves 124, 125 and 128 in FIGS. 13–15. In the circuit 104, according to the invention, shown in FIG. 12a, the load current is bypassed from the power supply voltage sources and the line impedances, and is returned directly to the amplifier. Hence, the load current does not develop voltage variations at the amplifier terminals V+ and V− even though the line impedances are nonzero, and thus curves 144, 145 and 148 of FIGS. 13–15 are indistinguishable from the "data sheet" performance curves.

The above interpretation is strictly correct if the amplifier output stages and the restoration circuit according to the invention operate in Class A. In Class B, the output current is not fully bypassed, and some variation in the amplifier supply voltages occurs. However, the load does not "see" these variations because the load is connected across two voltage dividers fed from the two amplifier power supply terminals: the divider on the left of the circuit in FIG. 9 consists of the upper and lower amplifier output stages, Q9 and Q10, and the divider on the right consists of the upper and lower restoration circuit output stages, Q11 and Q12. Thus, if the two voltage dividers are balanced (the same), which is the reason why the preferred form of the restoration circuit is a duplicate of the amplifier A1 output stages, any power supply terminal voltage variations are not transferred to the load.

It further appears that arrangement A2' performs like two infinite capacitances each connected between a respective line 140, 142 and the output of arrangement A2'.

Figure 16:
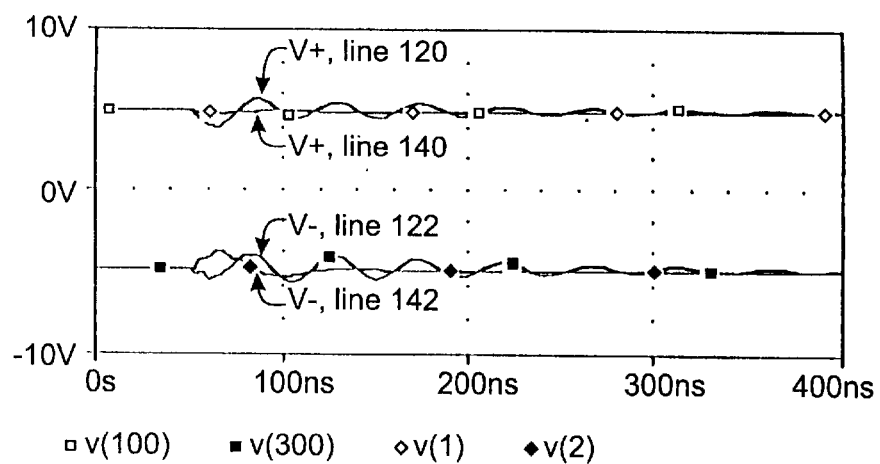

In the HFA0005 example described above, the output stages operate well into Class B. In FIG. 16, the positive and negative amplifier supply terminal voltages V+ and V− are shown for circuits 102 and 104 of FIG. 12a. In the circuit 104 according to the invention, the voltage variations are reduced though not eliminated entirely. Nevertheless, essentially complete restoration of the amplifier output is attained as seen in FIGS. 13–15.

The balanced voltage divider property described above is also the reason for the improved PSRR afforded by the circuit according to the invention: amplifier supply terminal voltage variations are shielded from the output, whether they arise from load current variations in nonzero line impedance (as above) or directly from power supply source variations. For the present example circuits, computer results were obtained for the circuits of FIGS. 17 (prior art) and 18 in which the two power supply voltage sources are modulated by in-phase signal voltages $v_p$.

Figure 17:
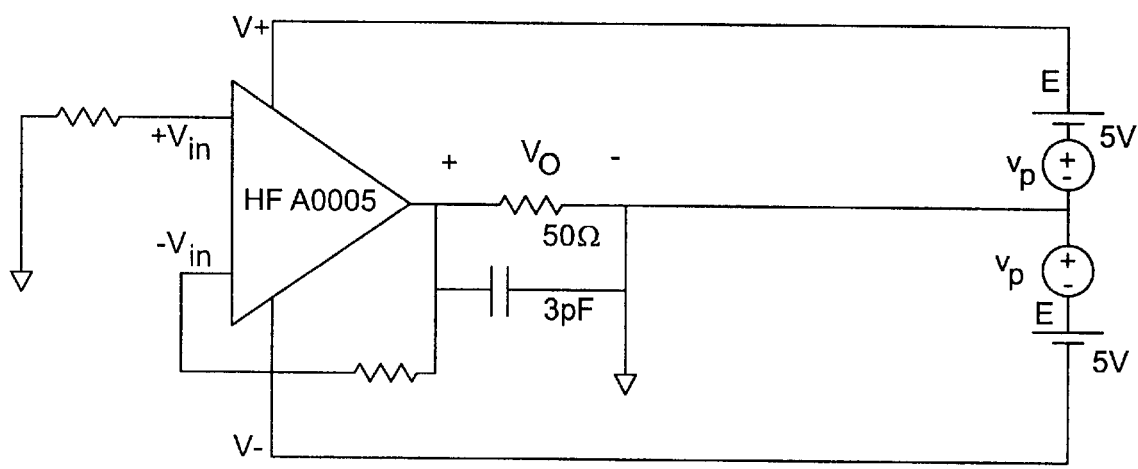
FIG. 17 is a circuit diagram of a prior art circuit configuration.
Figure 18:
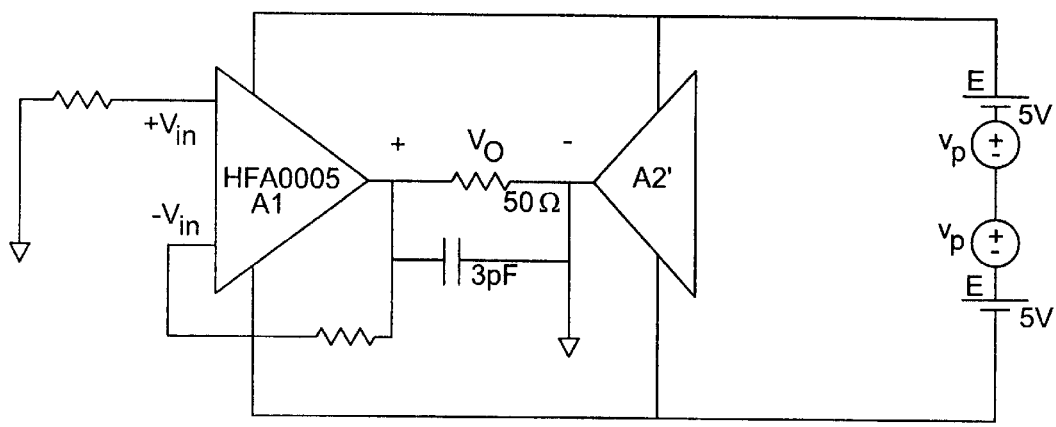
FIG. 18 is a circuit diagram similar to that of FIG. 17 showing a circuit configuration according to the present invention.
Figure 19:
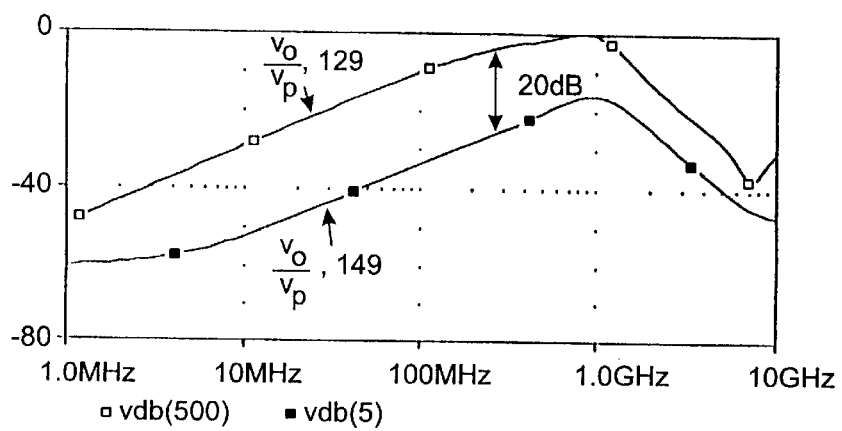
FIG. 19 is a signal diagram showing a comparison between operating characteristics of the circuits of FIGS. 17 and 18.

FIG. 19 shows the improvement offered by the invention with respect to the frequency response of the "power supply to output gain" $v_o/v_p$ (related to PSRR) for both the basic HFA0005 amplifier of FIG. 17, curve 129, and for the same amplifier with the added circuit according to the invention of FIG. 18, curve 149. The curves shown in FIG. 19 represent the result of modulating each voltage supply E with an identical ac signal which is frequency swept over the range of 1 MHz to 10 GHz, while $v_{in}$=0. While the response 129 of circuit 102 reaches a maximum of 0 db at 800 MHz, the response 149 of circuit 104 is more than 20 db lower. Approximately a 20 dB improvement (reduction) is afforded by the presence of the restoration circuit according to the invention.

The characteristics of a circuit according to the present invention, as described thus far, are based on the assumption that the input signal, $V_i$, has a zero dc offset and that the power supply voltages, $V_C$, $V_E$, are of equal magnitude. Under those conditions, it is of no significance, as regards dc currents anywhere in the circuit, if the center tap, or point of connection, 127 of FIG. 12a between the sources of voltages $V_C$ and $V_E$ is connected to ground or not. In FIG. 12a, point of connection 127 is shown to be isolated from ground, or floating. When $v_{in}$ has a value of zero, i(vrr) is equal to zero, as is the current between point 127 and ground.

Figure 20:
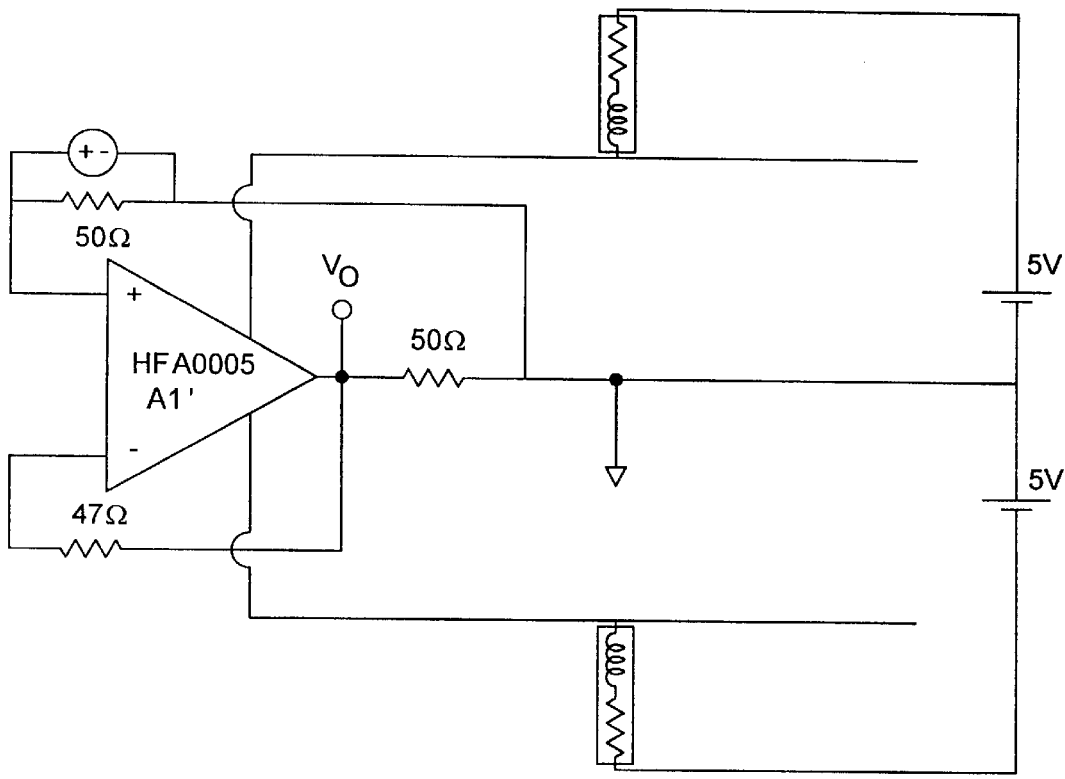
FIGS. 20 and 22 are circuit diagrams of practical embodiments of coupling circuits according to the prior art.
Figure 21:
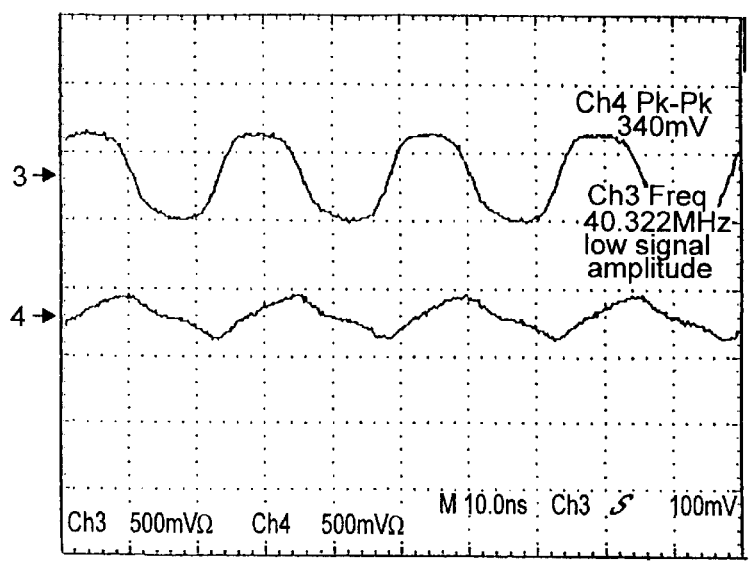
FIGS. 21 and 23 are signal waveform diagrams illustrating the performance of the circuits shown in FIGS. 20 and 22, respectively.

The computer results described above have been found to correspond closely to experimental results obtained with actual hardware. FIG. 20 shows a test circuit for an HFA0005 opamp that corresponds to the unity gain computer model 102 of FIG. 12a; the only significant difference is that no explicit line impedances were inserted in the experimental setup, and the impedances shown in FIG. 20 represent the combination of the impedance of about three feet of connecting wire and the output impedance of the lab power supply that provides the 5V. As seen in FIG. 21, in which the input (upper curve) and output (lower curve) signal waveforms are compared on the same scale, considerable output distortion is caused by the line impedances.

Figure 22:
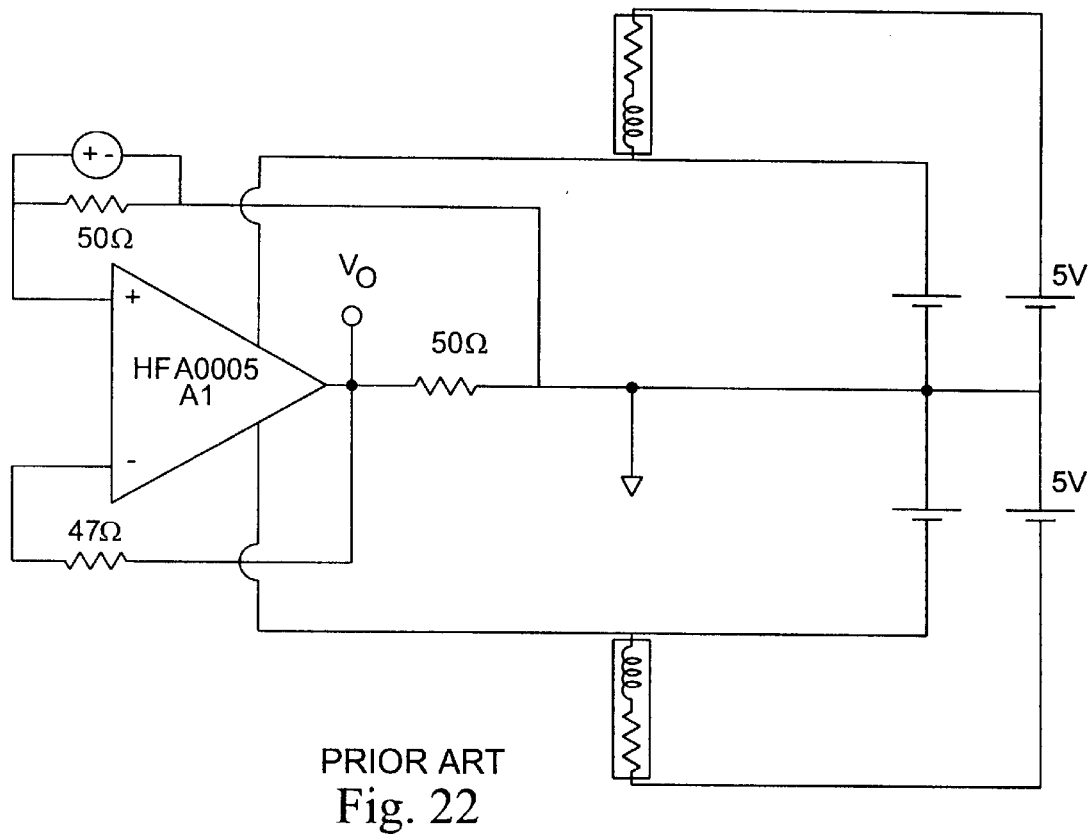
Figure 23:
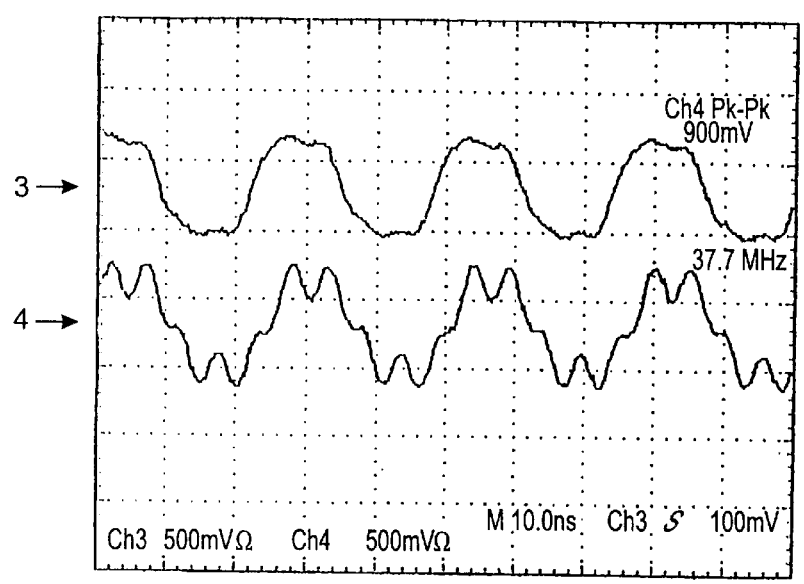

In anticipation of such undesirable results, circuit designers commonly employ bypass capacitors mounted as close as possible to the amplifier's power supply terminals. The results of doing this in the experimental setup are shown in FIGS. 22 and 23: the output distortion (lower curve) is significantly different, but is still bad. The reason is that the bypass capacitors are themselves not ideal zero impedances, and create additional resonances with the line impedances.

Figure 24:
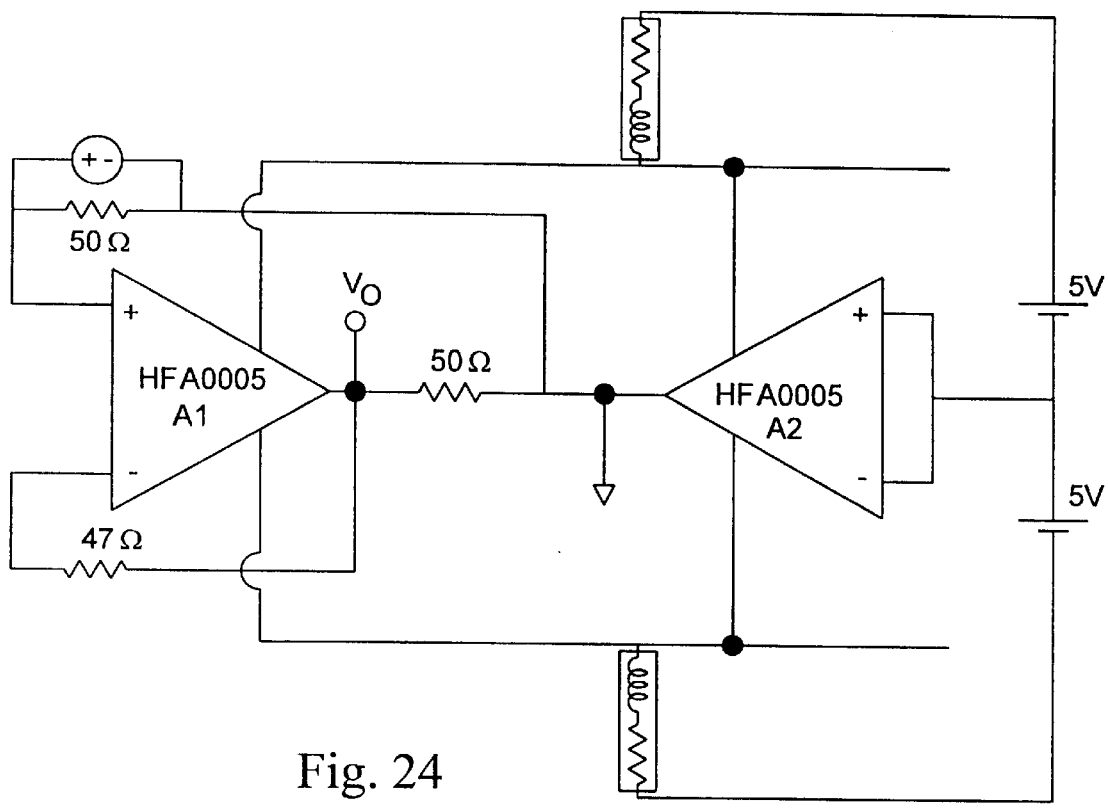
FIG. 24 is a circuit diagram of a coupling circuit according to a practical embodiment of the present invention.
Figure 25:
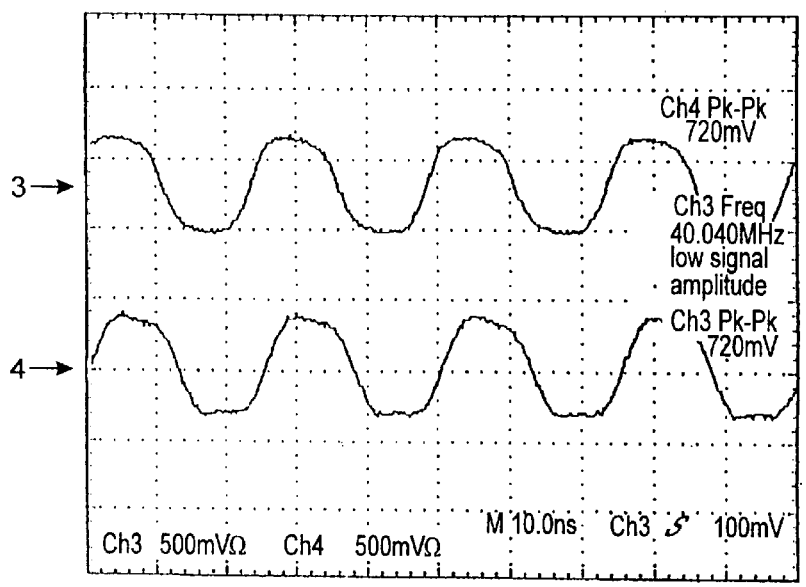
FIG. 25 is a signal diagram illustrating the performance of the circuit of FIG. 24.

A hardware embodiment of circuit 104 of FIG. 12a, a circuit according to the invention, is shown in FIG. 24. This circuit differs from that of FIG. 20 by the addition of the restoration circuit A2 in the form of a second HFA0005 opamp. Even though it is necessary only to embody the output stages of the HFA0005, it was not possible to separate those stages from the complete chip. However, by giving the HFA0005 A2 a zero signal input, the internal gain stages are not functional so, as desired, only the output stages are functional. It is seen from the experimental results of FIG. 25 that the presence of the restoration circuit according to the invention essentially restores completely the output (lower curve) signal waveform, and so the performance of the bypass capacitors has actually been exceeded by the circuit according to the invention.

Figure 26:
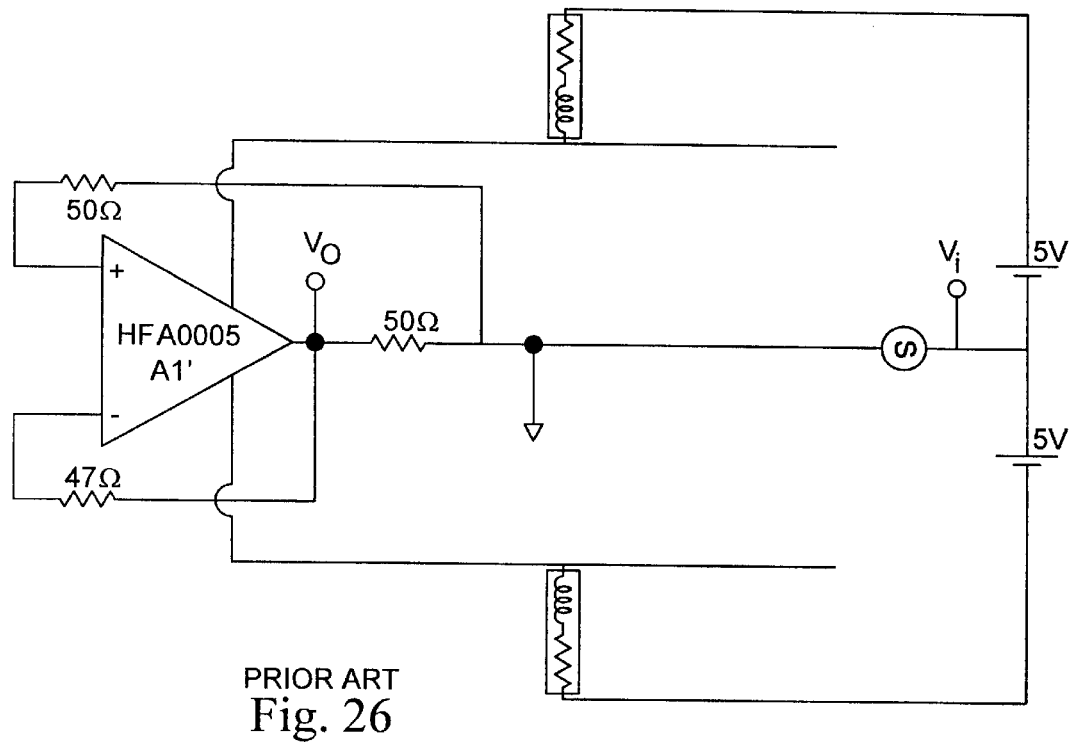
FIG. 26 is a circuit diagram of a practical embodiment of a coupling circuit according to the prior art.
Figure 27:
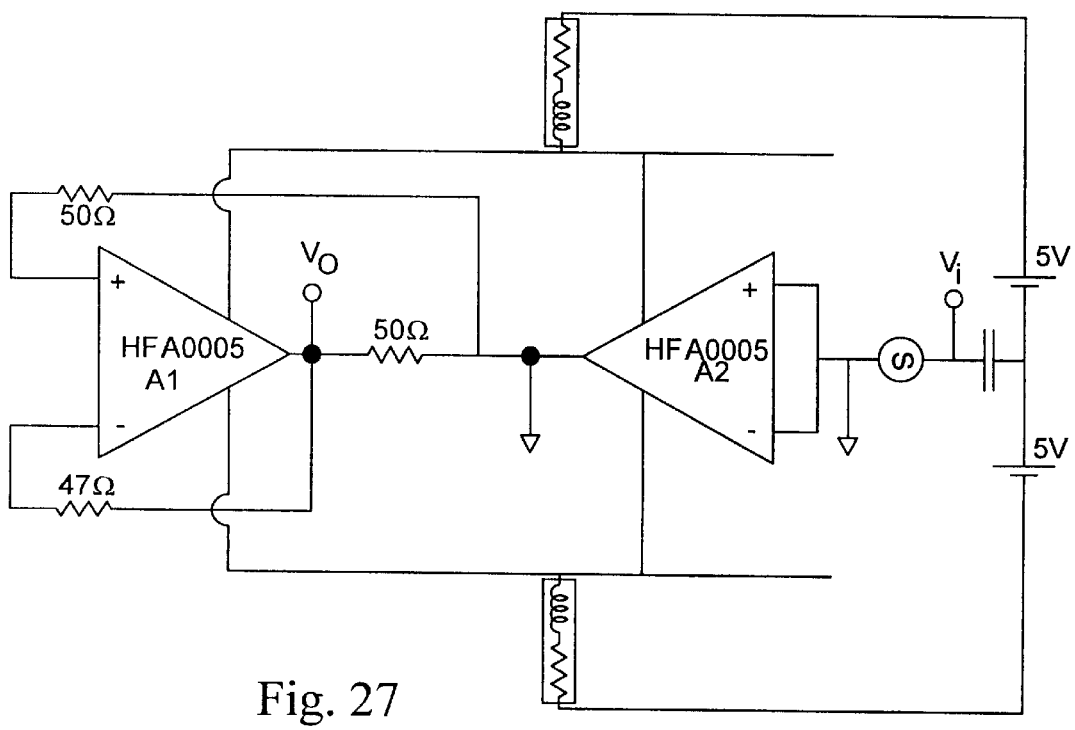
FIG. 27 is a circuit diagram of a practical embodiment of a coupling circuit according to the present invention.
Figure 28:
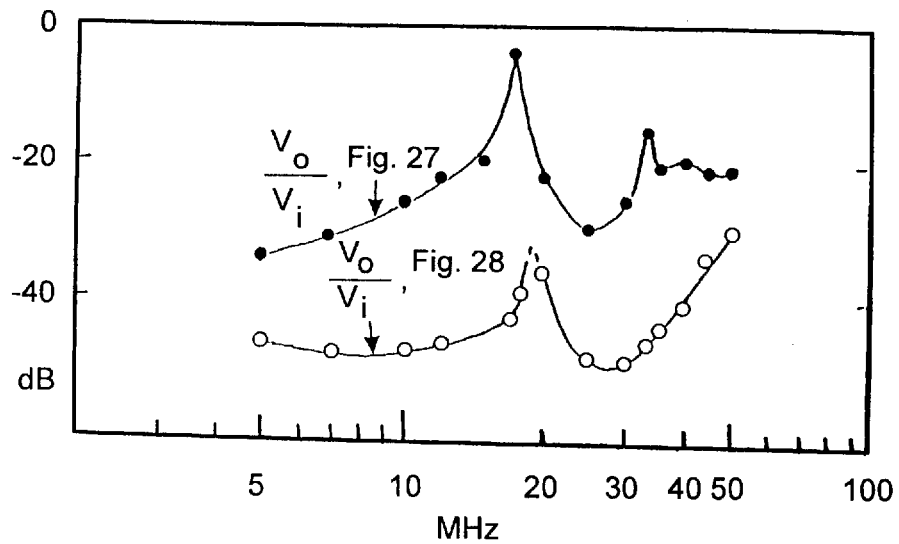
FIG. 28 is a signal diagram showing a comparison between operating characteristics of the circuits of FIGS. 26 and 27.

Experimental verification was also obtained of the PSRR improvement afforded by the circuit according to the invention. FIGS. 26 and 27 show experimental circuits corresponding to the computer models of FIGS. 17 and 18. Because it was inconvenient to provide the double excitation $v_p$, the experimental circuits employ a single excitation that provides the same modulation of the two power supply voltage sources. The frequency responses of the amplifier output voltages in the circuits of FIGS. 26 and 27 are shown in FIG. 28. As in the computer results of FIG. 19, the circuit according to the invention affords approximately a 20 dB improvement. The actual shapes of the two responses in FIG. 28 are different from those in FIG. 19 because the line impedances cannot be removed in the experimental circuit, as they can be in the computer model.

Figure 29:
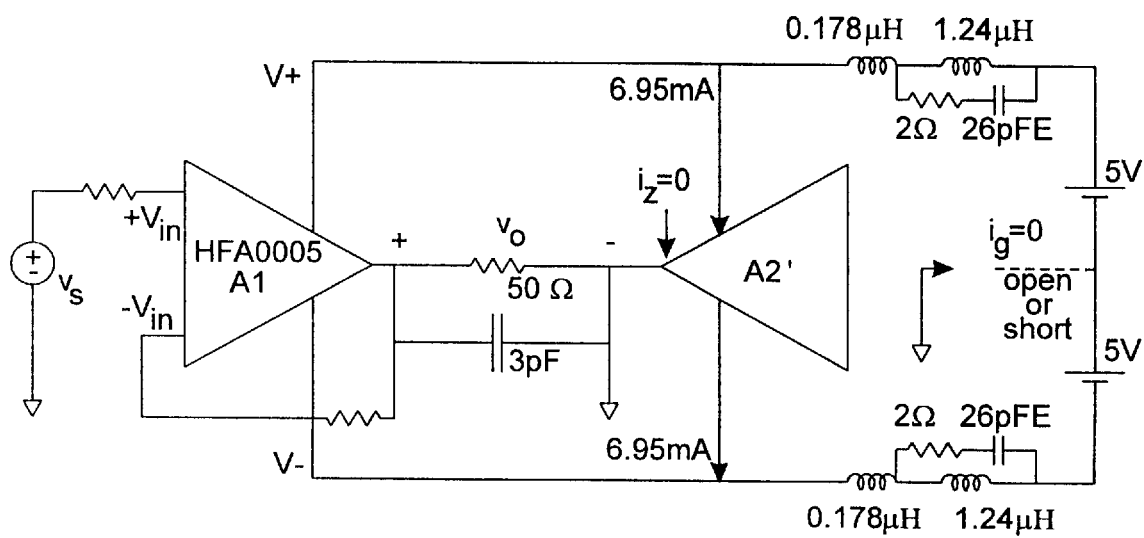
FIGS. 29, 30 and 31 are circuit diagrams of embodiments of circuits according to the present invention operated under respectively different conditions.

In the amplifier circuits according to the invention as described thus far, the two power supply voltage sources did not have their center tap connected to signal ground. If a circuit according to the invention is connected to have zero dc offset, and if the two voltage sources produce equal voltages, then it makes no difference to the zero-signal (dc) currents anywhere in the circuit if the power supplies are center-tapped to ground. These currents are shown in FIG. 29, in which it is seen that the "unbalance" currents $i_z$ and $i_g$ are zero.

Figure 30:
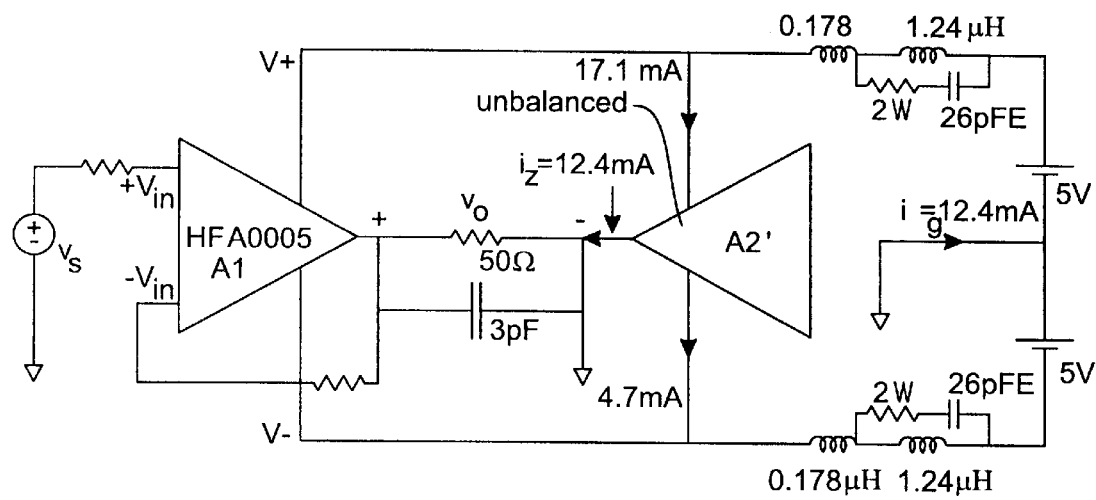
Figure 31:
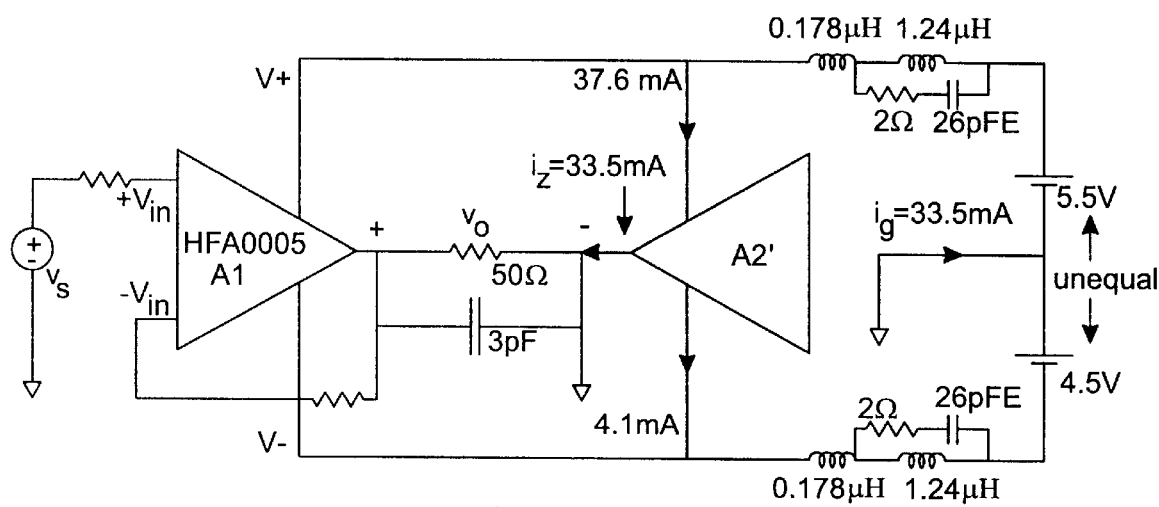

It is clearly desirable to be able to apply the circuits according to the invention in situations where the power supplies are grounded. Unfortunately, if in a circuit according to the invention there either is a dc offset or the power supply voltages are unequal with respect to ground, or both, then substantial unbalance currents flow. For example, FIG. 30 shows the various currents when the restoration circuit A2 has an unbalance, and FIG. 31 shows the currents when the positive and negative power supply sources are 5.5V and 4.5V respectively. These unbalance currents can be considerable, and essentially limit the application of the circuit according to the invention to situations where the circuit has its own floating power supply.

However, this limitation can be overcome by a modification of the restoration circuit.

Unbalanced output current in a circuit according to the invention is caused by high value resistors R10 and R11 of the embodiment of FIG. 9, or by the transistors, corresponding to Q5 and Q6, which those resistors replace, and therefore unbalances between these two effective resistance values, together with inequalities in the two power supplies, conspire to cause output unbalance.

Figure 32:
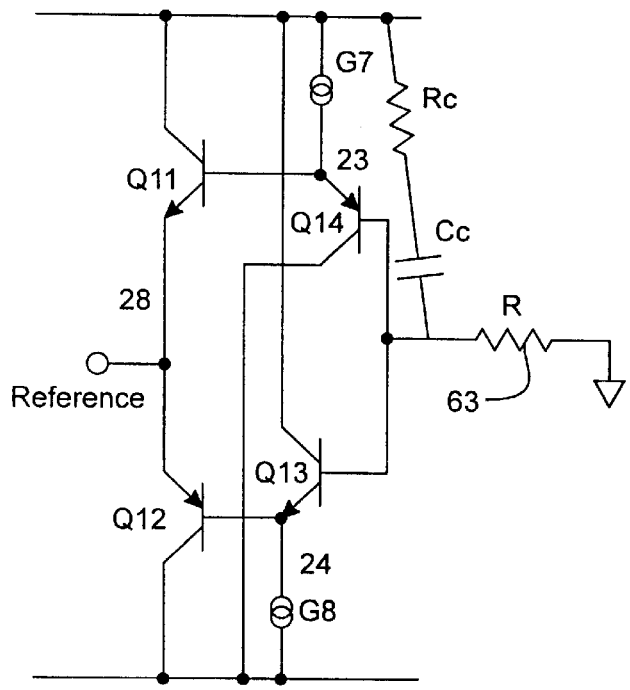
FIG. 32 is a circuit diagram of another embodiment of a circuit member according to the invention.

The modification for overcoming the above-discussed is to replace R10 and R11 by a single resistance 63 to ground, so that ground becomes the "input," or "reference," voltage for the preservation circuit embodiment shown in FIG. 32. Since the illustrated circuit has a voltage gain of unity, it is easy to build it in integrated form with a very small offset.

Figure 33:
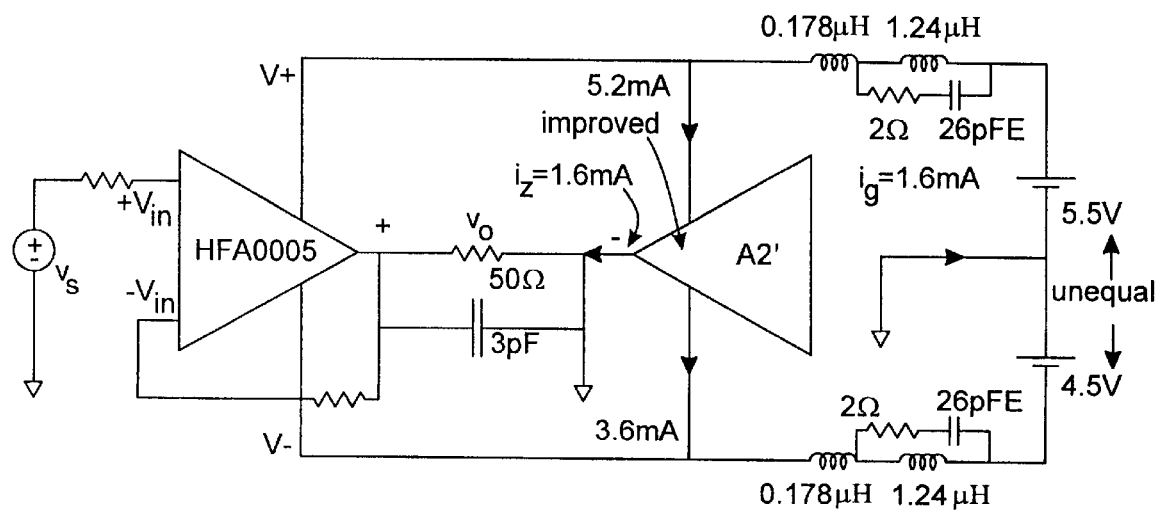
FIG. 33 is a circuit diagram illustrating a circuit according to the invention which contains the circuit member of FIG. 32.
Figure 34:
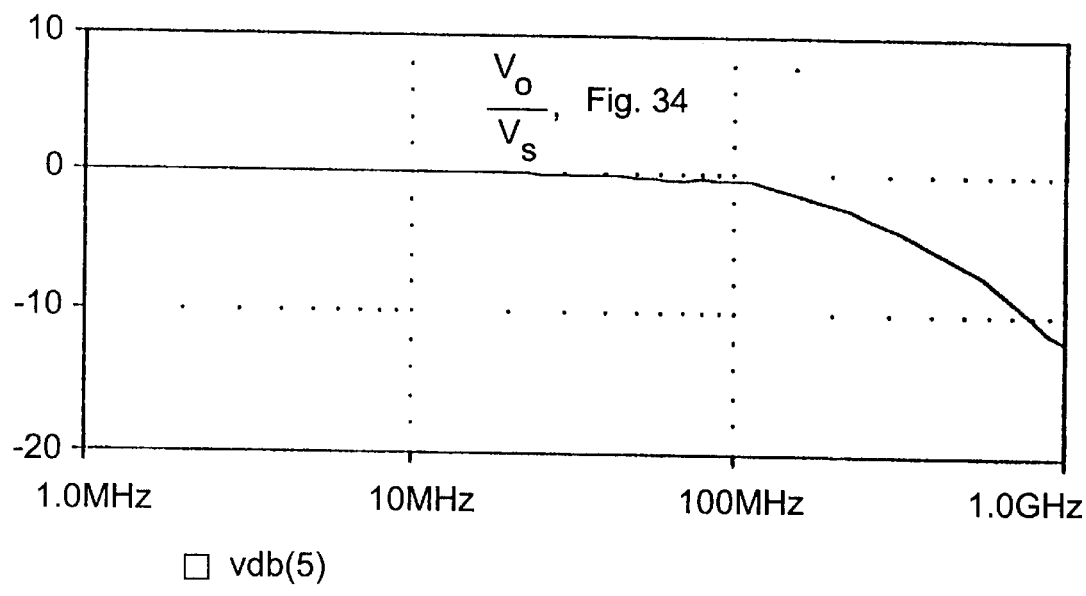
FIGS. 34, 35 and 36 are signal diagrams illustrating the performance of the circuit of FIG. 33.
Figure 35:
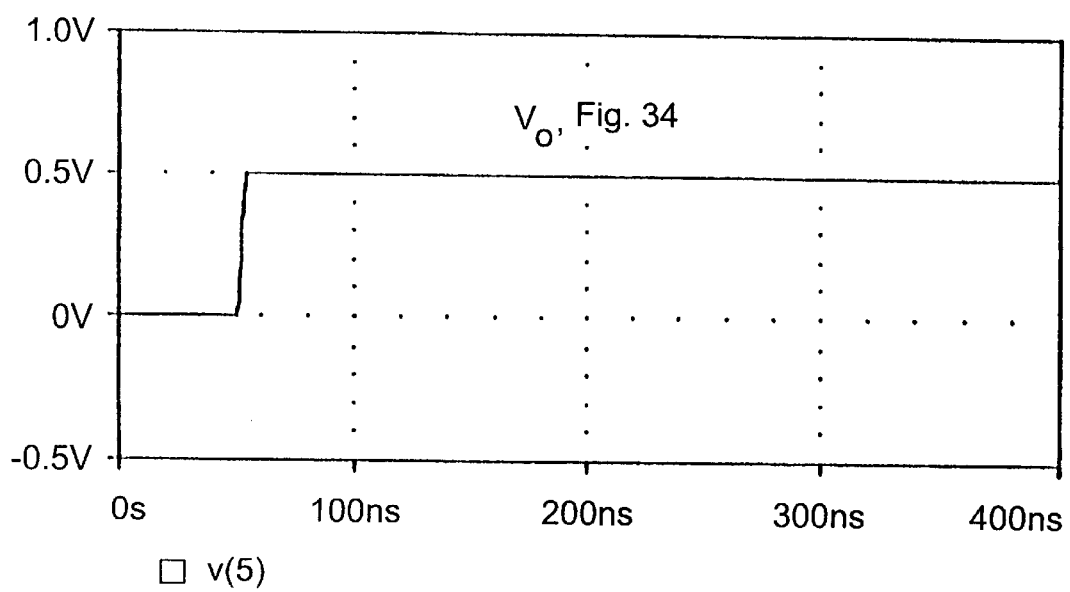
Figure 36:
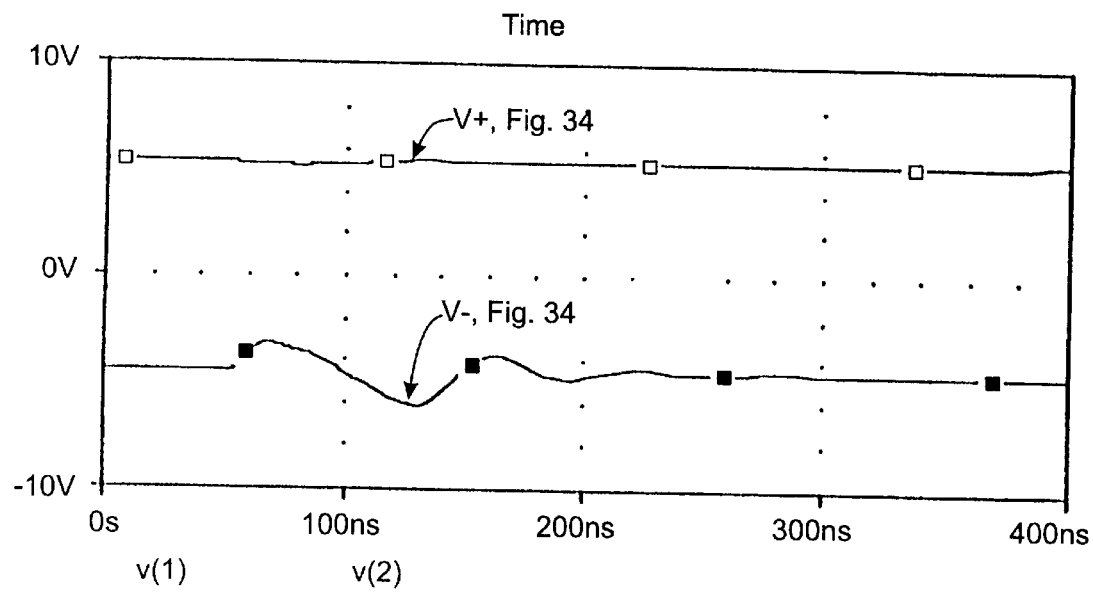

FIG. 33 shows the various currents with the improved circuit according to the invention, i.e. when restoration circuit A2 has the form shown in FIG. 32. The unbalance currents are now much smaller than in FIG. 31, in spite of the same unequal power supplies. The small-signal gain and step response are shown in FIGS. 34 and 35, respectively, and are seen to be essentially the same curves 144 and 148 as in FIGS. 13 and 15 for the circuit according to the invention with floating power supplies. The amplifier power supply terminal voltages V+ and V− are shown in FIG. 36, and are similar to the curves for lines 140 and 142 shown in FIG. 16.

Since the restoration circuit according to the invention can be a duplication of the associated amplifier output stage, if the amplifier is an integrated circuit, the restoration circuit according to the invention can conveniently be integrated on the same chip (and can employ the same on-chip-generated bias voltages). The resulting addition of a local ground terminal then enables a further extension, namely optimization of the detailed design.

In the circuit of FIG. 9, Cc and Rc in amplifier A1 represent the normal compensation network that controls the frequency response of the open-loop amplifier gain, and is returned to one of the voltage supply terminals rather than to signal ground simply because a signal ground is not normally available on the chip. In the restoration circuit A2' of FIG. 9, the same network is present in order to maintain the voltage divider balance property already discussed. However, when the amplifier A1 and the restoration circuit A2 or A2' are integrated on the same chip, both compensation networks can be returned directly to the available on-chip signal ground as shown in FIG. 37, resulting in further improvement of the PSRR property.

Figure 37:
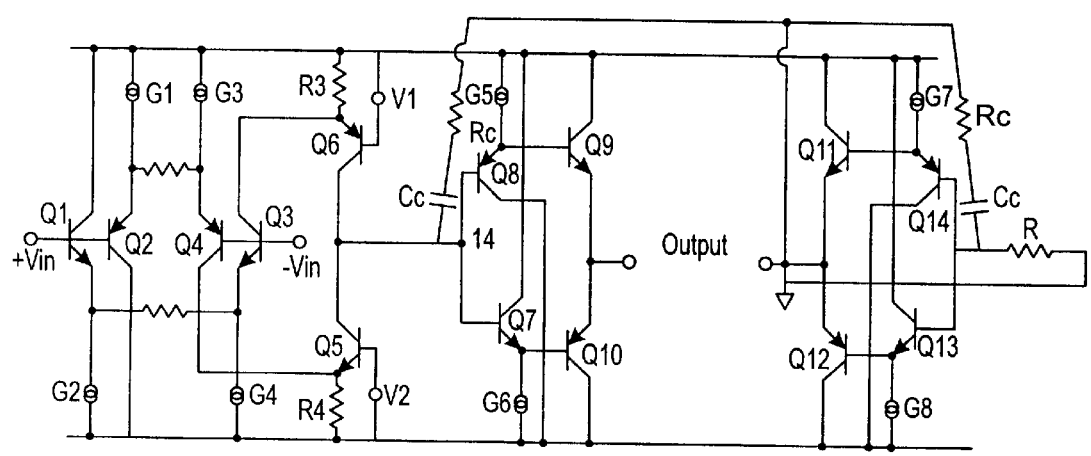
FIG. 37 is a diagram similar to that of FIG. 9 illustrating another preferred embodiment of the circuit according to the present invention.
Figure 38:
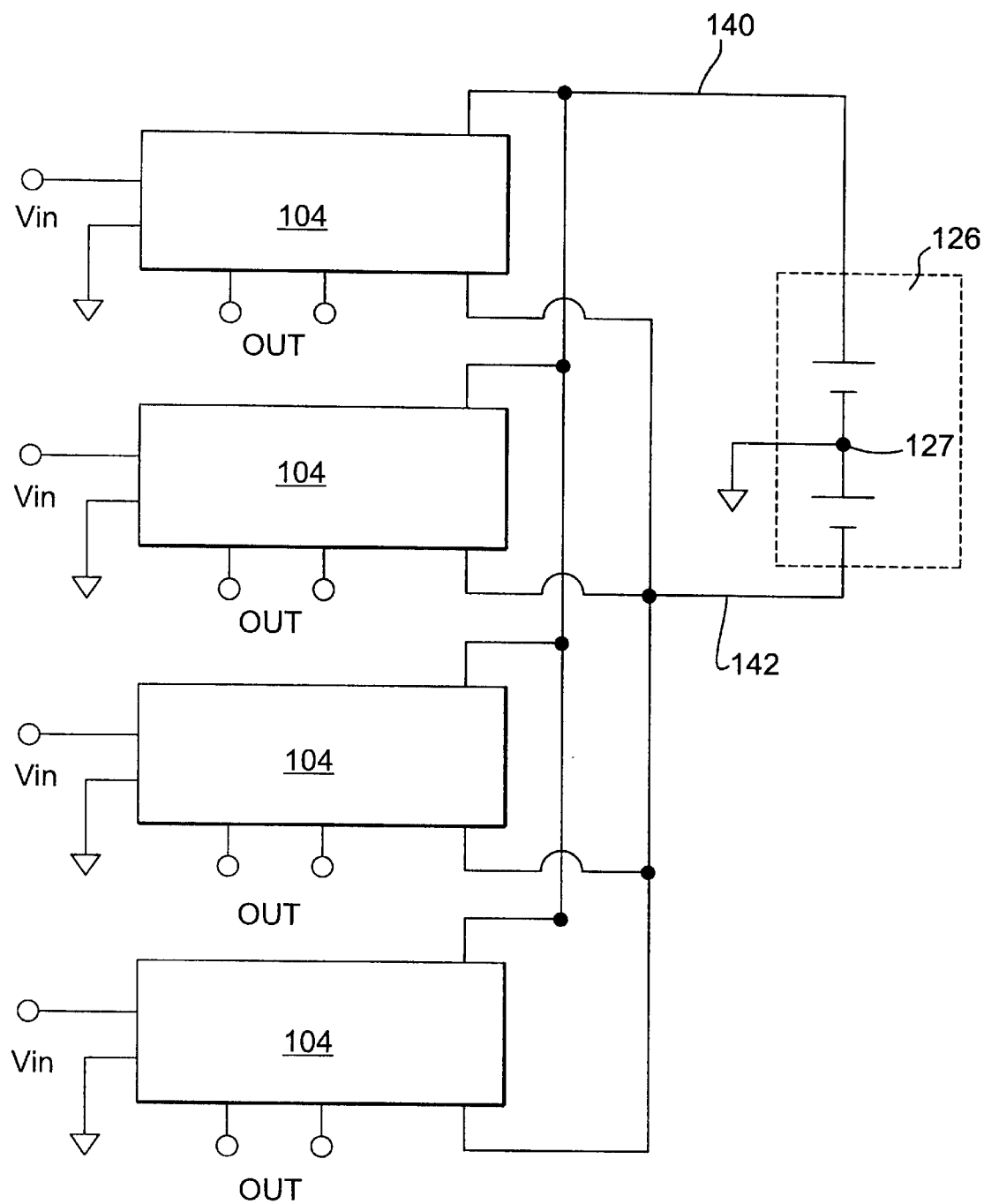
FIG. 38 is a diagram of a circuit assembly composed of a plurality of coupling circuits driven by a common power supply.

Because the present invention minimizes voltage variations on power supply lines 140 and 142, a plurality of circuits according to the invention can be driven from a single power source, particularly when each circuit 104 has the form shown in FIG. 37 or each restoration circuit has the form shown in FIG. 32. For example, as shown in FIG. 38, four such circuits 104 according to the invention, can be coupled via connecting lines 140 and 142 to a single d.c. power source 126, with the center tap 127 of source 126 grounded. It should be understood that although four circuits according to the invention are shown in FIG. 38, an arrangement composed of fewer than or more than four circuits can be employed, and will offer the benefits provided by the invention, the number of circuits 104 depending on the particular application in which the invention is to be employed.

A circuit according to the invention may be employed in virtually any type of electronics system, including analog and digital communication systems, analog and digital process control systems, navigation systems, radar systems, medical monitoring systems, etc. Examples of communication systems include broadcast systems for radio and television signals, audio systems, video systems, telephone networks, microwave transmission systems, satellite communication systems, etc. In any system of the type mentioned above, any amplifier stage or buffer stage may be constituted by an embodiment of a circuit according to the present invention.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed:

1. In a signal coupling circuit which includes: an input terminal for receiving an input signal from a source and first and second output terminals for supplying an output signal to a load; signal processing means connected between the input terminal and the first output terminal for deriving an output signal in response to the input signal and for supplying the output signal to a load connected between the output terminals to produce a load current in the load, the signal processing means having power supply terminals for receiving operating power; power supply means having a ground terminal; and connecting lines each having a finite impedance and connected for supplying operating power from the power supply means to the signal processing means, the improvement comprising distortion eliminating means connected between said power supply terminals and said second output terminal for directing load current to said power supply terminals so as to bypass the load current from said line impedances, said distortion eliminating means comprising at least one active circuit element and having an electric characteristic corresponding substantially to a capacitor with infinite capacitance.

2. A circuit as defined in claim 1 wherein said signal processing means comprise an amplifier having an output portion and said distortion eliminating means comprise a circuit unit which exhibits an electrical behavior substantially identical to said output portion.

3. A circuit as defined in claim 2 wherein there are two said power supply terminals, and said distortion eliminating means comprise: two active circuit elements, each of said active circuit elements having a controllable current path connected between said power supply terminals and a signal input connected to a common point; and two resistors each connected between the common point and a respective one of the power supply terminals.

4. A circuit as defined in claim 2 wherein there are two said power supply terminals, and said distortion eliminating means comprise: two active circuit elements, each of said active circuit elements having a controllable current path connected between said power supply terminals and a signal input connected to a common point; and a resistor connected between said common point and said second output terminal.

5. A circuit as defined in claim 2 wherein: there are two said power supply terminals; said distortion eliminating means comprise two active circuit elements, each of said active circuit elements having a controllable current path connected between said power supply terminals and a signal input connected to a first common point; said output portion of said amplifier comprises two active circuit elements, each of said active circuit elements having a controllable current path connected between said power supply terminals and a signal input connected to a second common point; and said circuit further comprises a frequency response compensation network connected between said second output terminal and each of said first and second common points.

6. A circuit as defined in claim 5 wherein said frequency response compensation network comprises: a first two-terminal RC circuit unit connected between said second output terminal and said first common point; and a second two-terminal RC circuit unit connected between said second output terminal and said second common point.

7. A circuit as defined in claim 2 wherein: there are two said power supply terminals; said distortion eliminating means comprise two active circuit elements, each of said active circuit elements having a controllable current path connected between said power supply terminals and a signal input connected to a common point; and said circuit further comprises a frequency response compensation network connected between said second output terminal and said common point.

8. A circuit as defined in claim 7 wherein said frequency response compensation network comprises a two-terminal RC circuit unit connected between said second output terminal and said common point.

9. A circuit as defined in claim 1 wherein there are two said power supply terminals, and said distortion eliminating means comprise: two active circuit elements, each of said active circuit elements having a controllable current path connected between said power supply terminals and a signal input connected to a common point; and two resistors each connected between the common point and a respective one of the power supply terminals.

10. A circuit as defined in claim 1 wherein there are two said power supply terminals, and said distortion eliminating means comprise: two active circuit elements, each of said active circuit elements having a controllable current path connected between said power supply terminals and a signal input connected to a common point; and a resistor connected between said common point and said second output terminal.

11. A circuit as defined in claim 1 wherein: there are two said power supply terminals; said distortion eliminating means comprise two active circuit elements, each of said active circuit elements having a controllable current path connected between said power supply terminals and a signal input connected to a first common point: said signal processing means comprise two active circuit elements, each of said active circuit elements having a controllable current path connected between said power supply terminals and a signal input connected to a second common point; and said circuit further comprises a frequency response compensation network connected between said second output terminal and each of said first and second common points.

12. A circuit as defined in claim 11 wherein said frequency response compensation network comprises: a first two-terminal RC circuit unit connected between said second output terminal and said first common point; and a second two-terminal RC circuit unit connected between said second output terminal and said second common point.

13. A circuit as defined in claim 1 wherein: there are two said power supply terminals; said distortion eliminating means comprise two active circuit elements, each of said active circuit elements having a controllable current path connected between said power supply terminals and a signal input connected to a common point; and said circuit further comprises a frequency response compensation network connected between said second output terminal and said common point.

14. A circuit as defined in claim 13 wherein said frequency response compensation network comprises a two-terminal RC circuit unit connected between said second output terminal and said common point.

15. A signal coupling system comprising:

a) power supply means having a ground terminal;

b) connecting lines each having a finite impedance and connected for supplying operating power from said power supply means; and c) a plurality of coupling circuits, each coupling circuit comprising:

1) an input terminal for receiving an input signal from a source and first and second output terminals for supplying an output signal to a load;

2) signal processing means connected between the input terminal and the first output terminal for deriving an output signal in response to the input signal and for supplying the output signal to a load connected between the output terminals to produce a load current in the load, the signal processing means having power supply terminals connected to said connecting lines for receiving operating power supplied from said power supply means; and 3) distortion eliminating means connected between said power supply terminals and said second output terminal for directing load current to said power supply terminals so as to bypass the load current from said line impedances, said distortion eliminating means comprising at least one active circuit element and having an electric characteristic corresponding substantially to a capacitor with infinite capacitance.

16. A signal coupling system as defined in claim 15 wherein, in each of said coupling circuits, said signal processing means comprise an amplifier having an output portion and said distortion eliminating means comprise a circuit unit which exhibits an electrical behavior substantially identical to said output portion.

* * * * *